United States Patent [19]

Kobayashi et al.

[11] Patent Number: 5,073,912

[45] Date of Patent: Dec. 17, 1991

[54] SAMPLE MOVING APPARATUS, SAMPLE MOVING SYSTEM AND SEMICONDUCTOR MANUFACTURING APPARATUS

[75] Inventors: Isao Kobayashi; Yosuke Hamada, both of Ibaraki; Kenji Mori, Tsuchiura; Hiromu Hirai, Tsukuba, all of Japan

[73] Assignee: Hitachi, Ltd., Tokyo, Japan

[21] Appl. No.: 436,036

[22] Filed: Nov. 14, 1989

[30] Foreign Application Priority Data

Nov. 16, 1988 [JP] Japan .................................. 63-287683

[51] Int. Cl.⁵ .............................................. G71K 5/10
[52] U.S. Cl. ....................................... 378/34; 414/354; 414/384; 250/491.1; 250/452.1
[58] Field of Search ............... 414/749, 754, 757, 774, 414/784; 350/531, 533; 378/34; 250/492.1, 491.1; 269/71, 73

[56] References Cited

U.S. PATENT DOCUMENTS

| 3,652,146 | 3/1972 | George | 350/531 |
| 4,042,119 | 8/1977 | Hassan et al. | 414/749 |
| 4,508,435 | 4/1985 | Graham et al. | 350/531 |
| 4,688,908 | 8/1987 | Moore | 350/531 |
| 4,702,565 | 10/1987 | Schilling et al. | 350/531 |
| 4,818,169 | 4/1989 | Schram | 350/531 |
| 4,948,330 | 10/1990 | Nomura et al. | 350/531 |

FOREIGN PATENT DOCUMENTS 62-252135 11/1987 Japan .

Primary Examiner—Edward P. Westin
Assistant Examiner—David P. Porta
Attorney, Agent, or Firm—Antonelli, Terry, Stout & Kraus

[57] ABSTRACT

A sample moving apparatus for positioning wafers with high accuracy, which apparatus comprises a fine adjustment actuator having a drive stroke to finely move the wafer, a fine adjustment stage driven by the fine adjustment actuator, a coarse adjustment actuator having a drive stroke to relatively coarsely move the wafer, a coarse adjustment stage driven by the coarse adjustment actuator, and a holder arrangement for attractively holding the wafer onto the wafer bearing surfaces of the respective stages. Upon selective energization of the holder arrangement of the respective stages, the wafer is moved while being attracted to the coarse adjustment stage or while being attracted to the coarse adjustment stage.

18 Claims, 21 Drawing Sheets

FIG. 21
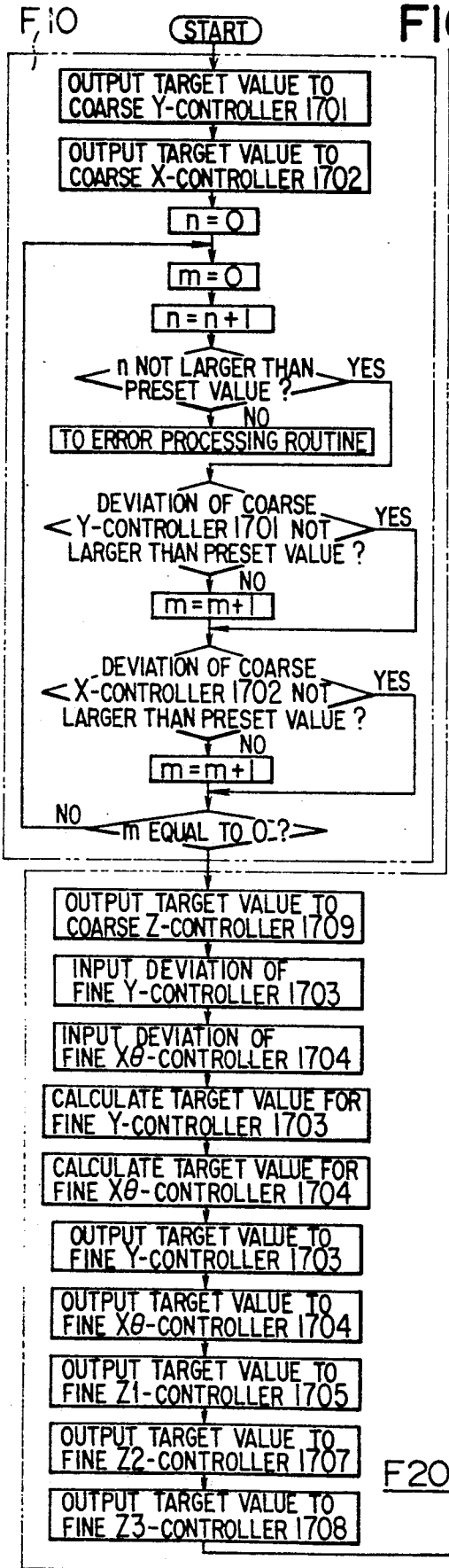
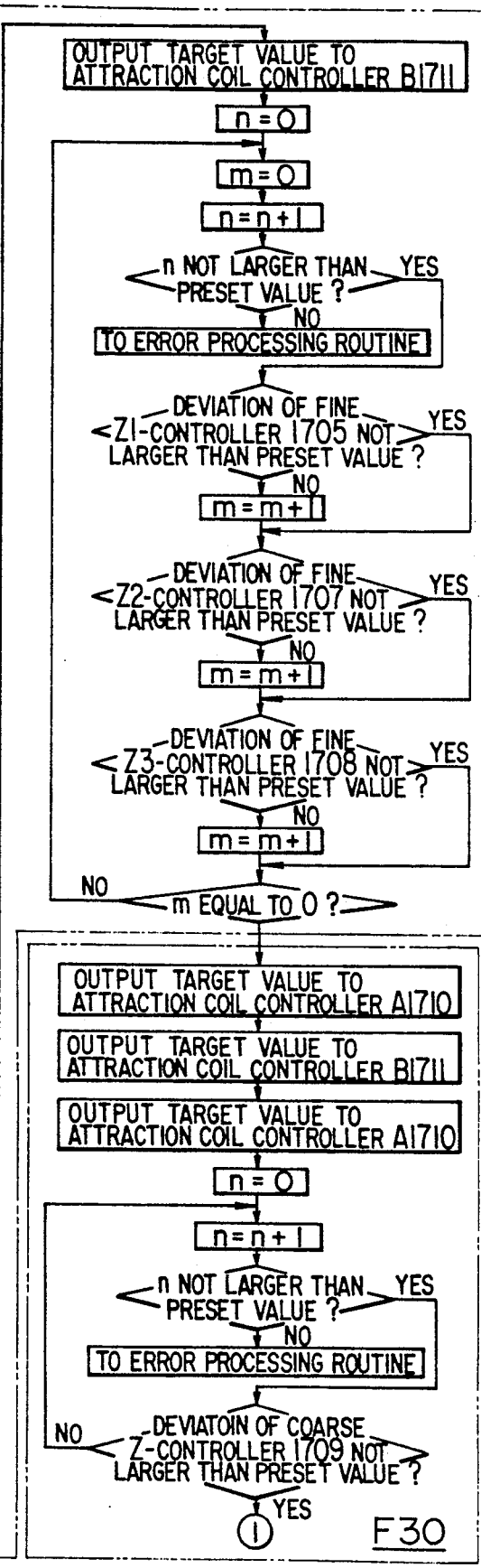

FIG. 28
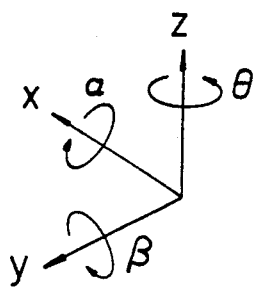
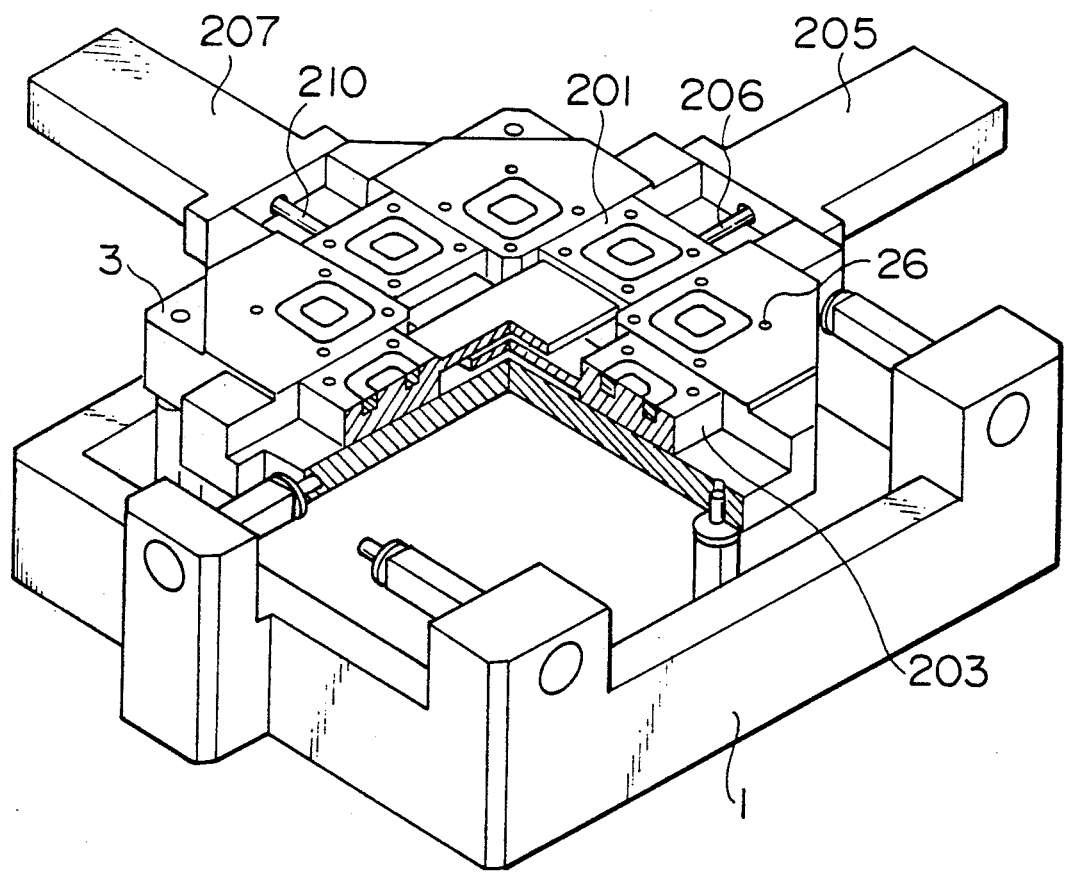

SAMPLE MOVING APPARATUS, SAMPLE MOVING SYSTEM AND SEMICONDUCTOR MANUFACTURING APPARATUS

BACKGROUND OF THE INVENTION

1. Field of the Invention

The present invention relates to a sample moving apparatus, a sample moving system and a semi-conductor manufacturing apparatus suitable for moving a sample which requires high-accurate positioning, such as a wafer for use in semiconductor manufacture.

In the mass production process of LSI chips, there is widely employed an exposure method based on the so-called step and repeat technique in which a circuit pattern is exposed to a wafer sequentially on the basis of shots one by one by repeatedly moving and positioning the wafer. This type exposure system requires a sample moving apparatus for moving and positioning wafers with high accuracy.

An XY-stage is generally used for such the sample moving apparatus. Improvement in array accuracy and stack accuracy of a pattern transcribed to wafers requires to improve positioning accuracy and moving accuracy of the XY-stage. In some cases, however, satisfactory accuracy is not always obtained due to limitations in machining accuracy of the XY-stage and performance of a positioning control device. In these cases, it is usual that a fine adjustment stage is stacked on the XY-stage to provide the so-called stacked type apparatus of coarse and fine adjustment, so as to compensate for error of the XY-stage by using the fine adjustment stage.

Recently, XY-stages have a tendency to become larger with an increase in a size of wafers, thereby making it more difficult to ensure high accuracy of the XY-stages. To solve this problem, in for example, Japanese Patent Unexamined Publication No. 62-252135 a method is proposed wherein a wafer chuck having almost the same size as that of an exposure shot and a wafer moving mechanism are provided, and a wafer is exposed in sequence while rechucking it by the wafer chuck for each shot.

SUMMARY OF THE INVENTION

In the foregoing prior art, however, positioning accuracy of wafers has been limited due to error factors below, which has posed one reason of retarding the development of LSI chips of still higher density: (a) In the stacked type of fine and coarse adjustment, position detecting error of the XY-stage and positioning error of the fine adjustment stage are multiplied by each other, and the thus-multiplied result determines final positioning error of wafers; and (b) Array accuracy of the pattern is lowered due to accumulated shifts in position occurring at each rechucking of the wafer.

It is an object of the present invention to provide a sample moving apparatus, a sample moving system and a semiconductor manufacturing apparatus suitable for eliminating the aforesaid factors and improving positioning accuracy of samples.

According to the present invention a fine adjustment actuator is provided on a base with a fine adjustment stage being driven by the fine adjustment actuator, and a coarse drive mechanism being provided on the same base. A coarse adjustment stage is driven by the coarse drive mechanism and holding means is provided for attractively holding a sample table onto the respective sample table bearing surfaces of the fine adjustment stage and the coarse adjustment stage.

In accordance with further features of the present invention, a base has a fine adjustment actuator mounted thereon, with a fine adjustment stage being driven by the fine adjustment actuator, and a coarse drive mechanism mounted on the base, drives a coarse adjustment stage. Means are provided for changing relative position levels of the object bearing surfaces of the fine adjustment stage and the coarse adjustment stage, with first holding means being formed in an object bearing surface portion of the fine adjustment stage for holding an object to be moved, and second holding means being formed in at an object bearing surface portion of the coarse adjustment stage for holding the object to be moved.

In accordance with still further features of the present invention, a carriage holds a sample, with the coarse adjustment stage having means for attracting the carriage being provided and being movable in directions of the x-y plane. A fine adjustment stage includes means for attracting the carriage and is movable at least in direction of the xy-plane independent of movement of the coarse adjustment stage. A coarse drive means drives the coarse adjustment stage, and a fine drive means drives the fine adjustment stage. Measuring means measure a position of the carriage on the xy-plane, and position control means derive an amount to be driven for control based on a deviation between a target value of the position of the carriage and a measured result of the measuring means, and then supply the derived amount to the fine drive means to thereby perform a positioning control.

The above and other objects, features, and advantages of the present invention will become more apparent from the following description when taken in connection with the accompanying drawings which show, for the purpose of illustration, several embodiments in accordance with the present invention.

BRIEF DESCRIPTION OF THE DRAWINGS

FIGS. 21-23 are flowcharts showing one example of a method of operating the embodiment shown in FIG. 20;

FIG. 28 is a perspective view showing another embodiment of the sample moving apparatus of the present invention.

DETAILED DESCRIPTION OF PREFERRED EMBODIMENTS

Figure 1:
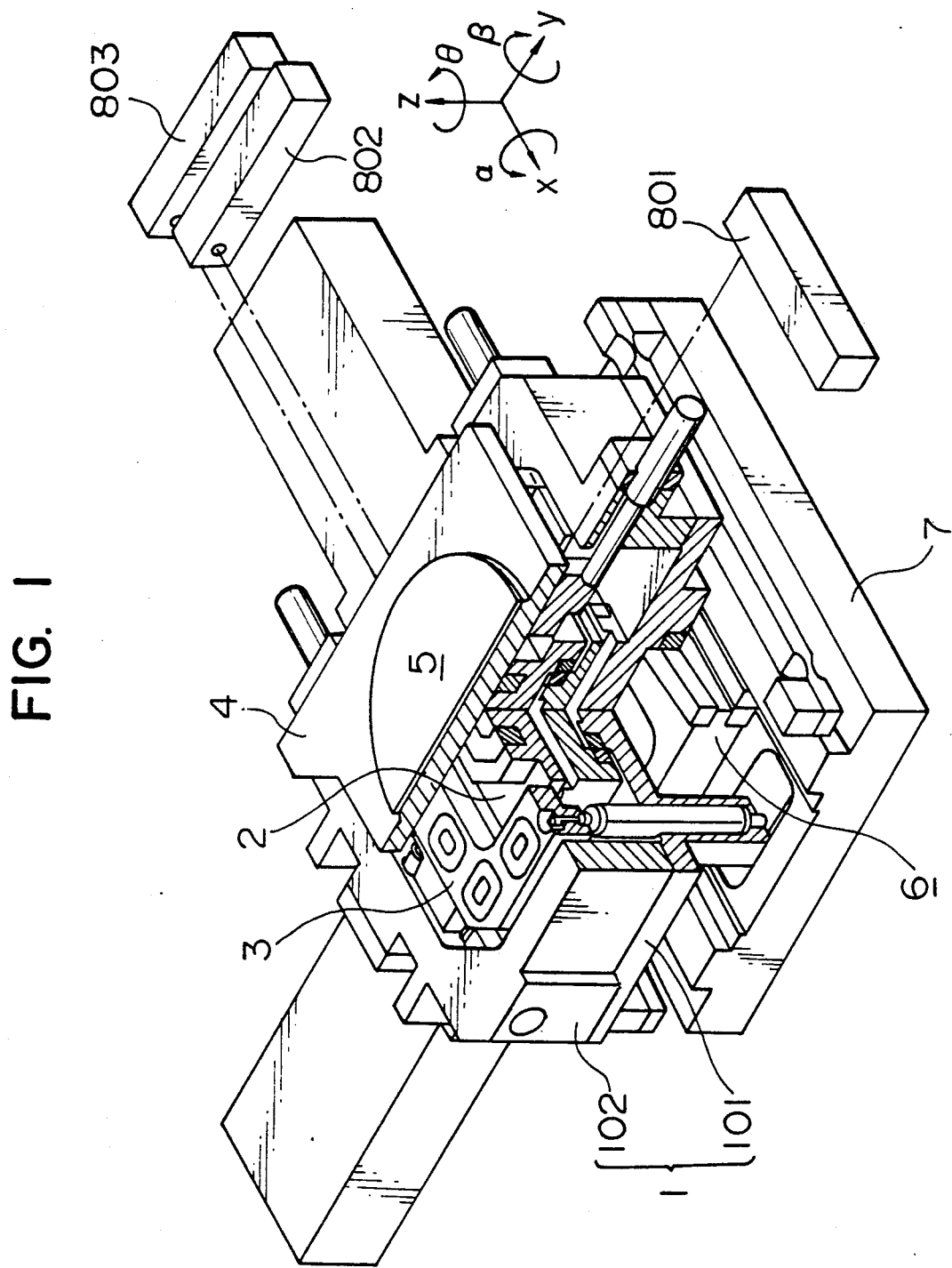
FIG. 1 is a perspective view showing one embodiment of a sample moving apparatus of the present invention.

Referring now to the drawings wherein like reference numerals are used throughout the various views to designate like parts and, more particularly, to FIG. 1, according to this figure, a sample moving apparatus of the present invention is applied to an exposure apparatus as one example of semiconductor manufacturing apparatus with the apparatus including a base 1 comprising a main table 101 and a frame 102 fixed to the main table 101, with a coarse adjustment stage 2 and a fine adjustment stage 3 being mounted on the base 1. A carriage 4 is in turn mounted on the coarse adjustment stage 2 and the fine adjustment stage 3. The coarse adjustment stage 2 and the fine adjustment stage 3 are provided with respective chucks for attracting the carriage 4, while a sample for example, a wafer 5 is attracted onto the carriage 4. When moving the wafer 5 in the x- and y-directions stepwise or in a large stroke, the carriage 4 is attracted to the coarse adjustment stage 2, and when moving the wafer 5 in the x-, y-, z-, α-, β- and θ-directions finely or in a small stroke, the carriage 4 is attracted to the fine adjustment stage 3. The main table 101 is attached to a surface plate 7 through a gap adjusting device 6. The position of the carriage 4 is measured by three length gauges 801, 802 and 803.

Figure 2:
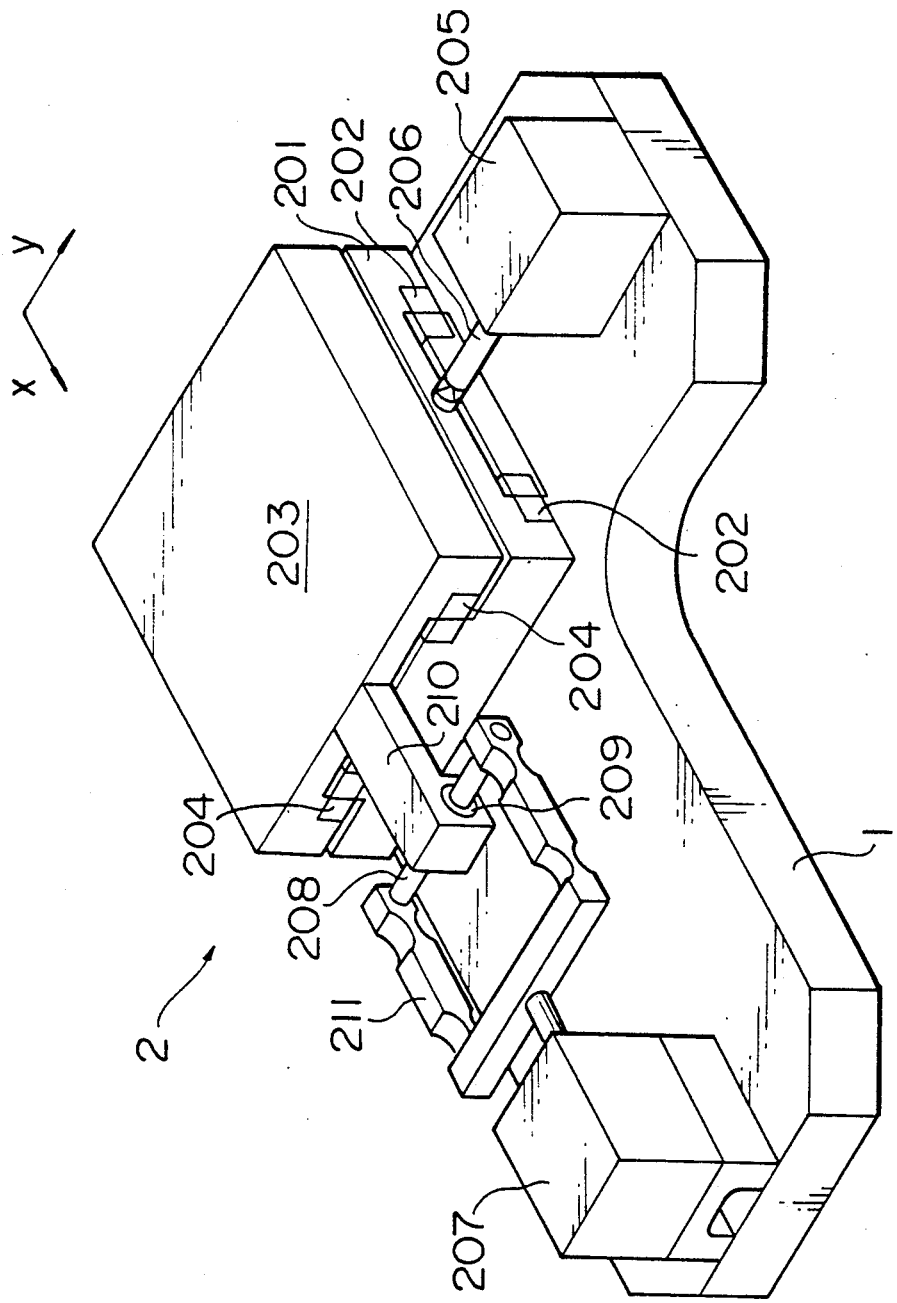
FIG. 2 is a perspective view showing one practical example of a coarse adjustment stage.
Figure 3:
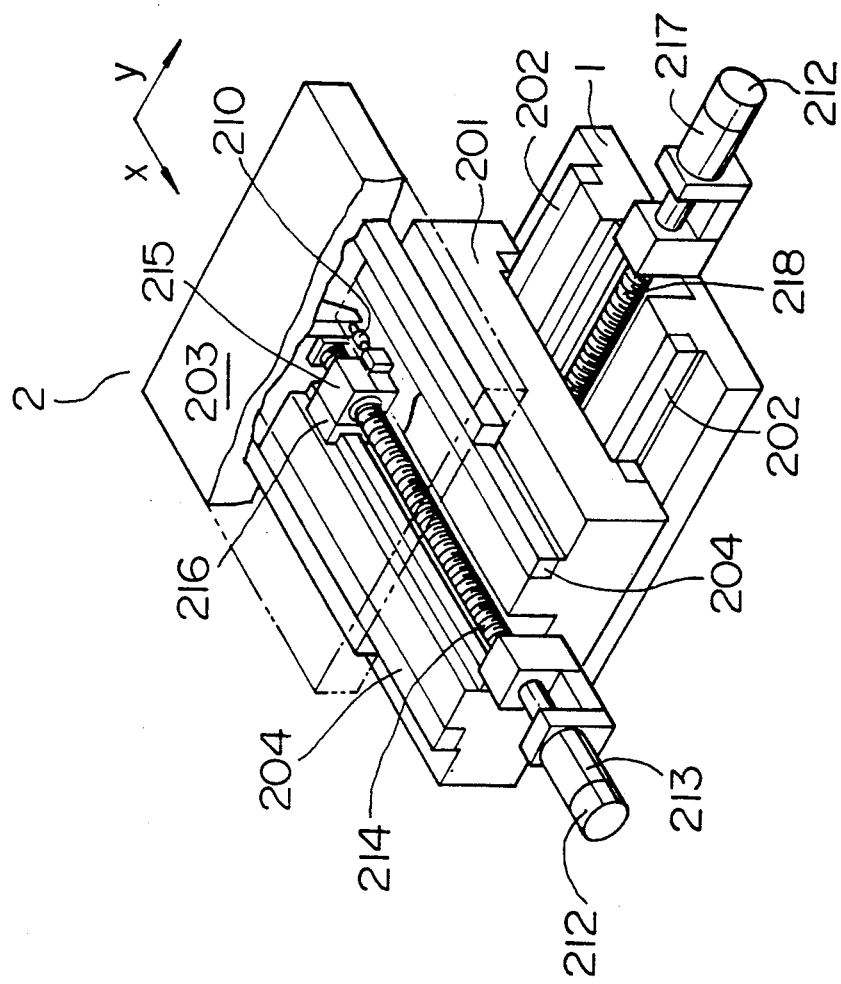
FIG. 3 is a perspective view showing another practical example of the coarse adjustment stage.

As shown in FIG. 2, the coarse adjustment stage 2 includes Y-table 201 mounted on the base 1 to be movable in the y-direction by a Y-guide mechanism 202, and an X-table 203 mounted on the Y-table 201 to be movable in the x-direction by an X-guide mechanism 20 The Y-table 201 is driven through a Y-rod 206 by a Y-drive mechanism 205 mounted on the base 1. The X-table 203 is driven by an X-drive mechanism 207 mounted on the base 1, through both an X-rod 210 provided with a bushing 209 built in a guide bar 208 to be slidable in the y-direction and an X-drive member 211 for holding the guide bar 208. The Y-drive mechanism 205 and the X-drive mechanism 207 may be voice coil motors or direct-acting type actuators using a combination of rotary motors and feed screw mechanisms. The Y-guide mechanism 202 and the X-guide mechanism 204 may be direct-acting type rolling guides, sliding guides or static guides, for example. Similarly, the guide bar 208 and the bushing 209 may be direct-acting type rolling guides, sliding guides or static guides, for example. As shown in FIG. 3, a Y-table 201 is mounted on the base 1 to be movable in the y-direction by a Y-guide mechanism 202, and an X-table 203 is mounted on the Y-table 201 to be movable in the x-direction by an X-guide mechanism 204. An X-motor 213 having a rotary encoder 212 built therein and an X-feed screw 214 driven by the X-motor 213 are provided on the Y-table 201, with an X-nut 215 held in mesh with the X-feed screw 214 driven by the X-motor 213 are provided on the Y-table 201, with an X-nut 215 held in mesh with the X-feed screw 214. The X-nut 215 is guided in the x-direction by an X-nut guide mechanism 216 provided on the Y-table 201. The X-table 203 is driven by the X-nut 215 through an X-rod 210. Likewise, the Y-table 201 is driven by a Y-motor 217 having a rotary encoder 212 built therein, a Y-feed screw 218, a Y-nut (not shown), a Y-nut guide mechanism (not shown), and a Y-rod (not shown). The X-drive screw 214 and the Y-drive screw 218 may be of ball screws, sliding screws or static screws, for example. Furthermore, the Y-guide mechanism 202 and the X-guide mechanism 204 may be of direct-acting type rolling guides, sliding guides or static guides, for example.

In either of FIGS. 2 and 3, the X-table 203 is moved in the x- and y-directions and functions as the coarse adjustment stage 2. But the coarse adjustment stage 2 is not limited to those two types as mentioned above. In essence, the coarse adjustment stage 2 need only have a function capable of moving the carriage 4 in the x- and y-directions. In this connection, strokes or moved amounts of the coarse adjustment stage 2 in the x- and y-directions can be determined, for example, by using the rotary encoder 212 shown in FIG. 3, or the length gauges 801, 802 and 803 in the case where the carriage 4 is attracted to the coarse adjustment stage 2 as shown in FIG. 1. It is to be noted that the Y-rod 206, the X-rod 210 and the X-drive member 211 shown in FIGS. 2 and 3 serve not to transmit thrusts of the drive mechanisms, but also prevent error in straightness of motions of the drive mechanisms from affecting that of motions of the Y-table 201 and the X-table 203.

As shown in FIG. 3, the fine adjustment stage 3 is driven by six actuators 301, 302, 303, 304, 305 and 306 provided as fine drive means on the base 1 (FIG. 1). Displacements of the fine adjustment stage 3 during a driven state are measured by nine sensors 307, 308, 309, 310, 311, 312, 313, 314 and 315 provided on the base 1.

The actuator 301 is employed when driving the fine adjustment stage 3 in the y-direction, and stroke shifts in this case are measured by the sensor 307 provided on the same axis as that of the actuator 301. The actuators 302 and 303 arranged perpendicularly to the actuator 301 are employed when driving the fine adjustment stage 3 in the x-direction and rotating it in the $\theta$-direction, and stroke shifts in these cases are measured by the sensor 308 provided on the same axis as that of the actuator 302 and the sensor 309 provided on the same axis as that of the actuator 303. The actuators 304, 305 and 306, arranged perpendicularly to the actuators 301, 302 and 303, are employed when driving the fine adjustment stage 3 in the z-direction and rotating it in the $\alpha$- and $\beta$-directions, and stroke shifts in these cases are measured by the sensors 310, 311; 312, 313 and 314, 315 arranged parallel to the actuators 304, 305 and 306. The actuators 304 and the sensors 310, 311 have their center axes positioned in the same plane such that the center axis of the actuator 304 is located between the center axes of the sensors 310 and 311. The actuators 305, 306 and the sensors 312, 313; 314, 315 are also arranged in a like manner.

With the above arrangement, the displacement produced when driving the actuator 301 can be determined by the sensor 307, the displacement produced when driving the actuator 302 can be determined by the sensor 308, the displacement produced when driving the actuator 303 can be determined by the sensor 309, the displacement produced when driving the actuator 304 can be determined from a mean value of detected results by the sensors 310 and 311, the displacement produced when driving the actuator 305 can be determined from a mean value of detected results by the sensors 312 and 313, and the displacement produced when driving the actuator 306 can be determined from a mean value of detected result by the sensors 314 and 315, respectively. Furthermore, as shown in FIG. 1, when the carriage 4 is attracted to the fine adjustment stage 3, displacements in the x- and y-directions of the fine adjustment stage 3 and a rotated amount or angular shift in the $\theta$-direction thereof can be determined using the length gauges 801, 802 and 803. The sensors 307, 308, 309, 310, 311, 312, 313, 314 and 315 may be of capacitance type sensors, eddy current type sensors, or differential transformers, for example. The length gauges 801, 802 and 803 may be of laser type length gauges, for example.

Figure 5:
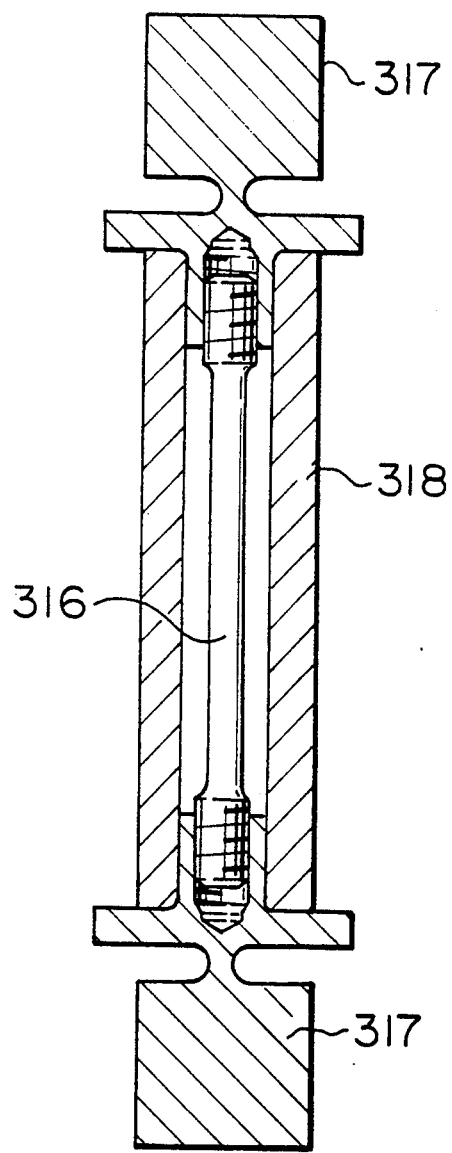
FIG. 5 is a sectional view showing one practical example of the actuator for driving the fine adjustment stage.

FIG. 5 provides a practical example of the actuators 301, 302, 303, 304, 305 and 306 for driving the fine adjustment stage 3 used in the embodiment of FIG. 1. A piezoelectric element 318 axially bored into a hollow shape is fixedly held by a pair of mount portions 317 threaded over the opposite ends of a bolt 316 inserted through the piezoelectric element 318. The mount portions 317 are each attached to either of the base 1 and the fine adjustment stage 3. By applying voltage to the piezoelectric element 318, the piezoelectric element 318 is caused to extend or contract in the axial direction thereof, whereby the bolt 316 is elastically deformed to displace the mount portions 317 in the vertical direction in FIG. 5.

Figure 4:
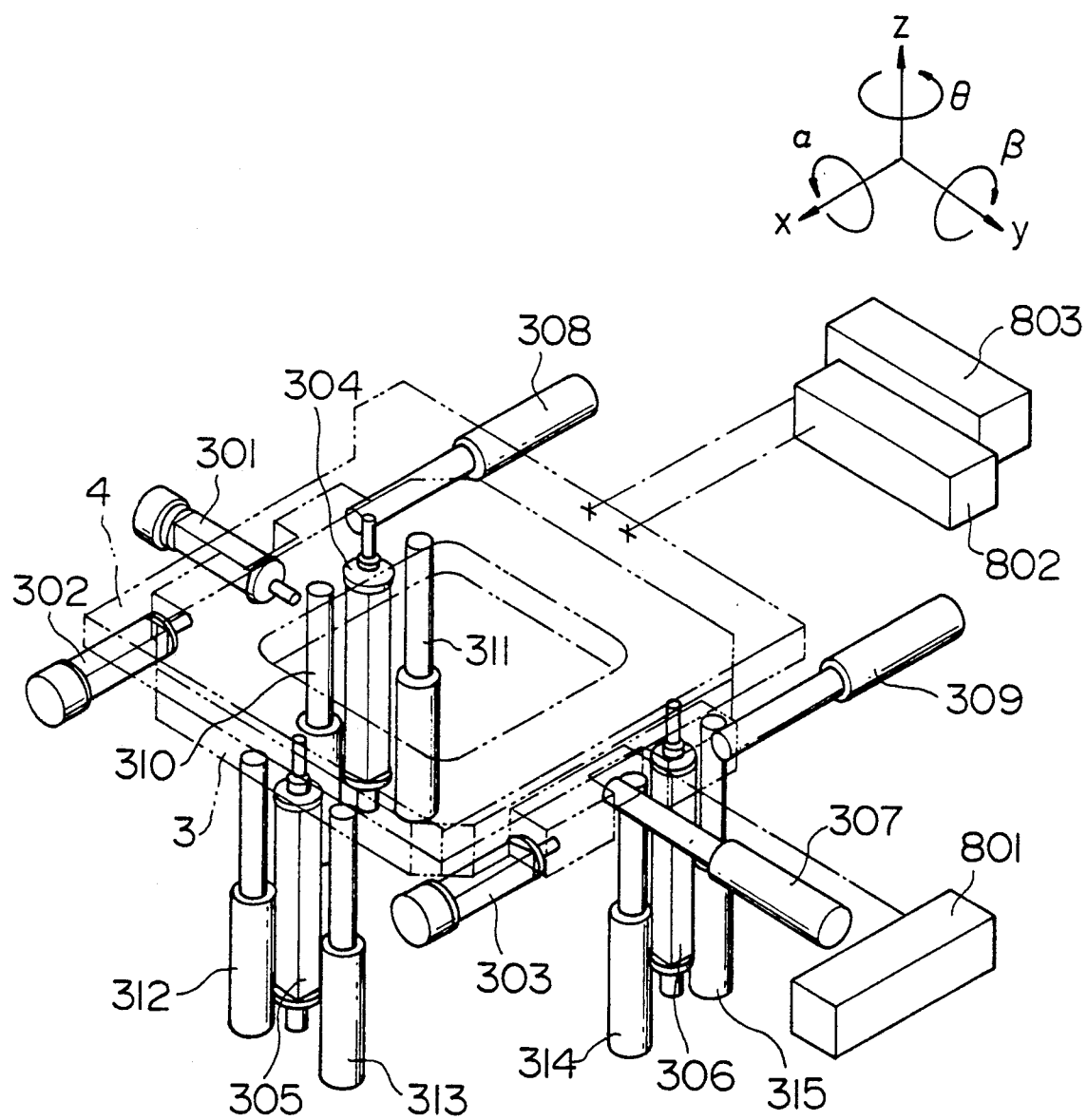
FIG. 4 is a perspective view showing an arrangement example of actuators for driving a fine adjustment stage.

Note that the method of driving the fine adjustment stage 3 and the actuators used for implementing the method are not limited to those mentioned above by referring to FIGS. 4 and 5. In essence, it is only needed that the resulting structure is capable of moving the fine adjustment stage 3 at least in the x- and y-directions.

Figure 6:
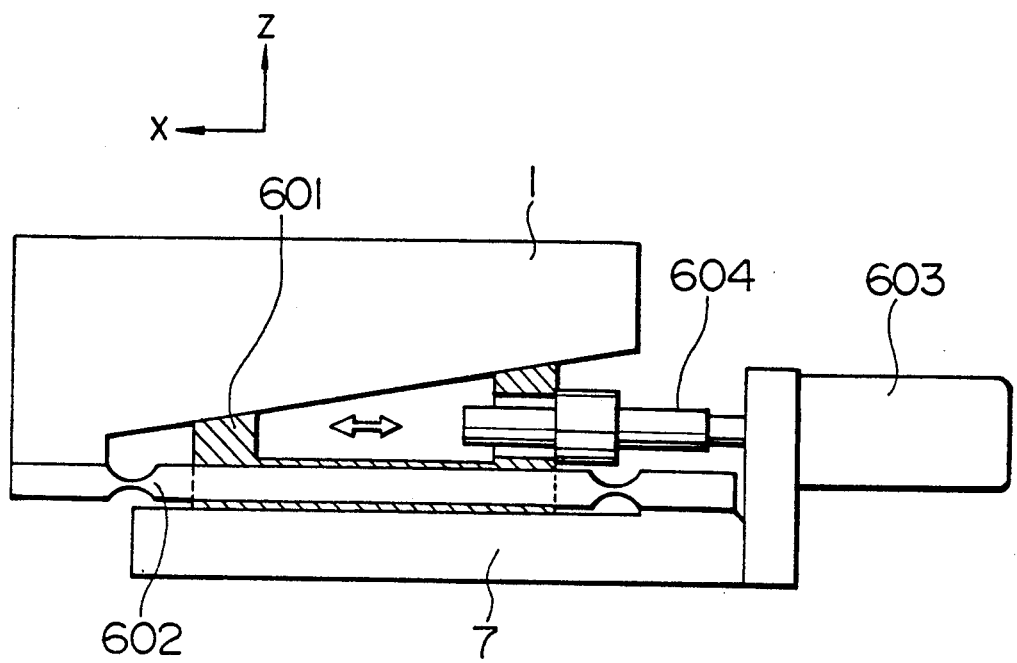
FIG. 6 is a partially sectional view showing one practical example of a gap adjusting device.

As shown in FIG. 6, the adjusting device 6 of FIG. 1 a slider 601 having a slope surface inserted between the base 1 and the surface plate 7, with the base 1 and surface plate 7 being joined with each other by a link 602 provided at its opposite ends with elastic hinge mechanisms. The slider 601 is driven in the x-direction by a slider drive mechanism 604 comprising a Z-motor 603 and a feed screw mechanism. The above arrangement permits the base 1 to move parallel to the z-direction. The Z-motor 603 may be of a DC motor with a rotary encoder built therein, or a stepping motor, for example. Note that the structure of the gap adjusting device 6 is not limited to the above one, and may be modified in any other suitable manner so long as it is capable of transferring the base 1 in the z-direction in parallel.

Figure 7:
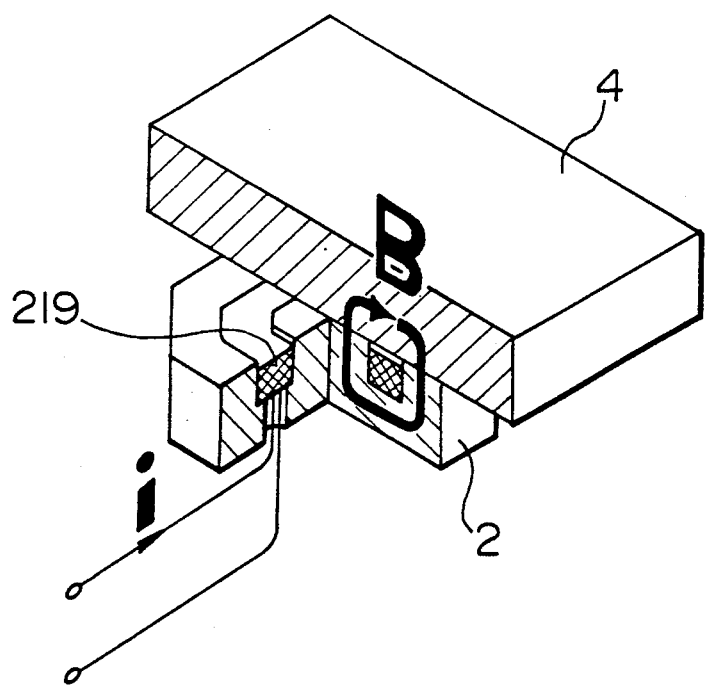
FIG. 7 is a perspective view showing one practical example of an electromagnetic chuck formed on the stage surface.

FIG. 7 provides one example of a means for holding the carriage 4 onto the coarse adjustment stage 2 (or the fine adjustment stage 3) in the sample moving apparatus according to the present invention. A coil 219 is fitted in a groove machined on the surface of the coarse adjustment stage 2. By energizing the coil 219, the carriage 4 is electromagnetically attracted to the coarse adjustment stage 2. With the similar arrangement, the carriage 4 can also instead be electromagnetically attracted to the fine adjustment stage 3 (FIG. 1). The mechanism for attracting the carriage 4 to the coarse adjustment stage 2 or the fine adjustment stage 3 is not limited to the this embodiment, and may be practiced by utilizing vacuum attraction or electrostatic attraction, for example. Moreover, the holding means is not limited to the type of holding the carriage by attraction.

Figure 8:
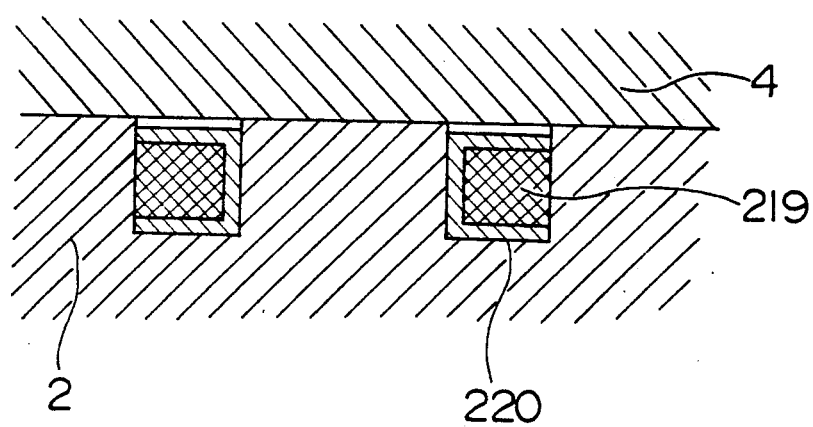
FIG. 8 is a sectional view showing one practical example of the electromagnetic chuck.

FIG. 8 provides a practical example of a method of fixing the coil 219 in the case where the carriage 4 is electromagnetically attracted to the coarse adjustment stage 2 or the fine adjustment stage 3. The coil 219 wound around a coil bobbin 220 is fitted in a groove machined on the surface of the coarse adjustment stage 2. By energizing the coil 219, the carriage 4 is electromagnetically attracted to the coarse adjustment stage 2. With the similar arrangement, the carriage 4 can also be electromagnetically attracted to the fine adjustment stage 3 (FIG. 1).

Figure 9:
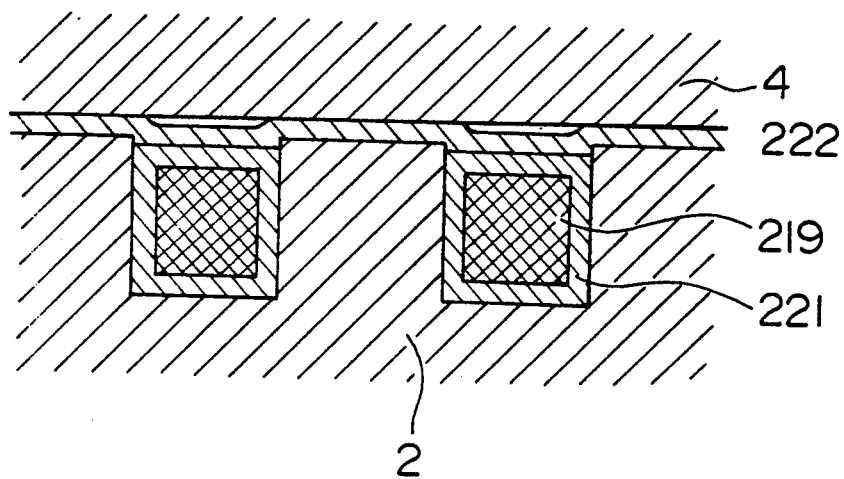
FIG. 9 is a sectional view showing another practical example of the electromagnetic chuck.

FIG. 9 provides a second example of the method of fixing the coil 219 in the case where the carriage 4 is electromagnetically attracted to the coarse adjustment stage 2 or the fine adjustment stage 3. The coil 219 is fitted in a groove machined on the surface of the coarse adjustment stage 2. By energizing the coil 219, the carriage 4 is electromagnetically attracted to the coarse adjustment stage 2. Clearances between the groove walls and the coil 219 are filled with a filler 221, while the surface of the coarse adjustment stage 2 is covered with a thin coating 222. This embodiment is advantageous in allowing an easy cleaning of the surface of the coarse adjustment stage 2. The filler 221 may be of a high polymer material such as epoxy resin, for example, and the coating 222 may be of a non-electrolytic nickel plated layer, for example. Materials usable for the filler 221 and the coating 222 are, of course, not limited to the above materials. With the similar arrangement, the carriage 4 can also be electromagnetically attracted to the fine adjustment stage 3 (1).

Figure 10:
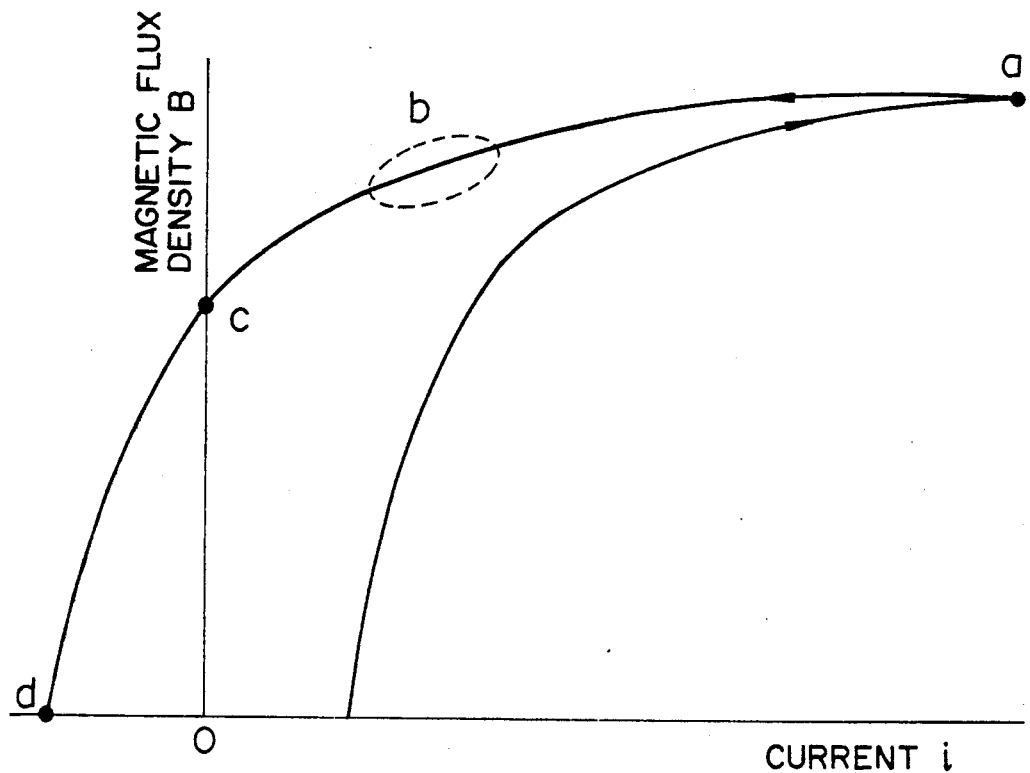
FIG. 10 is a graph for explaining one example of a coil energizing method in the electromagnetic chuck.

FIG. 10 graphically explains one example of a coil energizing method in the case where the carriage 4 is electromagnetically attracted to the coarse adjustment stage 2 or the fine adjustment stage 3 in the embodiment of FIG. 1. The graph indicates the relationship between a current i flowing through the coil 219 and the magnetic flux density B generated by the current i. Assuming now that the materials (magnetic materials such as iron) of the coarse adjustment stage 2, the fine adjustment stage 3 and the carriage 4 are properly selected so as to provide magnetic hysteresis characteristics. Under this condition, even with the current i reduced (region b) after it has been increased up to a preset maximum value (point a), the magnetic flux density B is lowered to the extent that the carriage 4 can be continuously attracted to the coarse adjustment stage 2 or the fine adjustment stage 3 in an effective manner. Even if the current i is cut off (point c), the residual magnetic flux is still enough to attract the carriage 4 to the coarse adjustment stage 2 or the fine adjustment sage 3. When stopping the attraction, it is simply necessary to apply a reverse current (point d). With this embodiment, the carriage 4 can be attracted to the coarse adjustment stage 2 or the fine adjustment stage 3 by a small current, which is suitable for energy saving It is also possible to prevent excessive heating of the attraction mechanism and hence to reduce positioning error, such as thermal deformation, due to heating. Further, the carriage 4 can be prevented from slipping off in the event of power outage.

Figure 11:
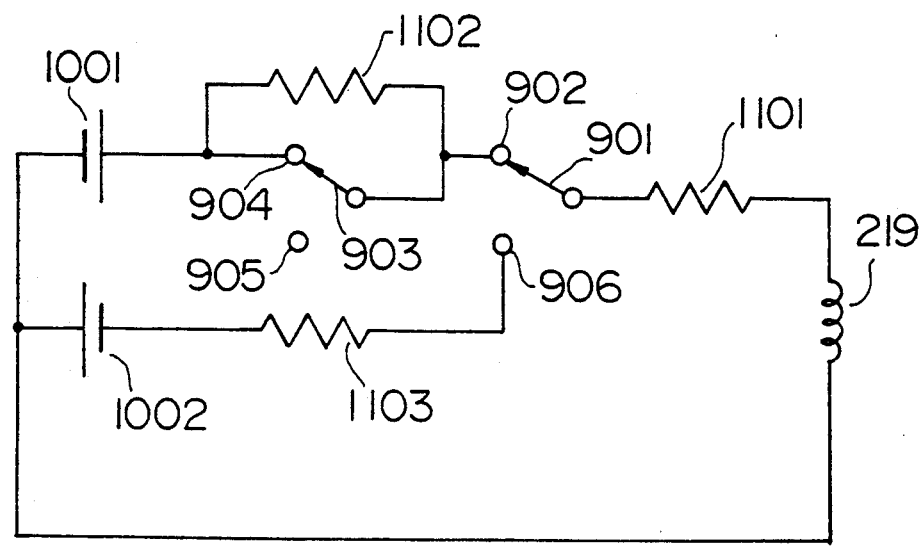
FIG. 11 is a feeder circuit diagram for implementing the coil energizing method shown in FIG. 10.

FIG. 11 provides a circuit diagram of one example of a feeder circuit for implementing the coil energizing method as stated above, i.e., for energizing the coil 219 in the case where the carriage 4 is electromagnetically attracted to the coarse adjustment stage 2 or the fine adjustment stage 3. When a change-over switch 901 is turned to a contact 902 and a change-over switch 903 is turned to a contact 904, the preset maximum current flows from a power supply 1001 to the coil 219 through a resistor 1101. Next, when the change-over switch 901 is turned to the contact 902 and the change-over switch 903 is turned to a contact 905, the current flows from the power supply 1001 to the coil 219 through resistors 1101 and 1102 so that a value of the current is reduced. Then, when the change-over switch 901 is turned to a contact 906, the current flows from a power supply 1002 to the coil 219 is reversed through resistors 1101 and 1103. With such circuit arrangement, the method of energizing the coil 219 as illustrated in FIG. 10 can be implemented. Note that the method of energizing the coil 219 is not limited to the above embodiment. Alternatively, a constant current may be applied to energize the coil 219, for example.

Figure 12:
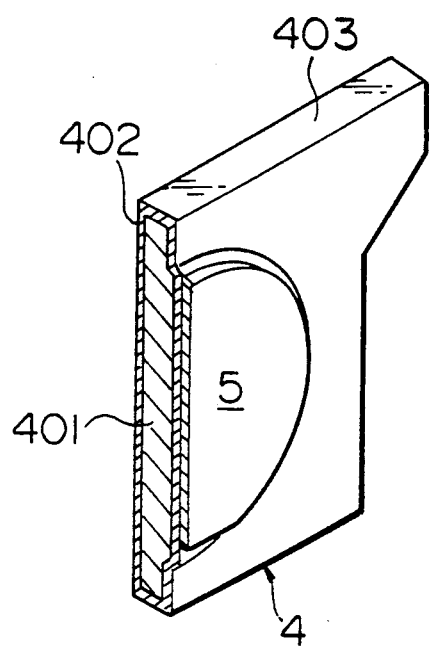
FIG. 12 is a perspective view showing one example of a carriage 4.

FIG. 12 provides a practical example of the carriage 4 used in the embodiment of FIG. 1. The surface of a basic material 401 is covered with a plated layer 402, a part of which is formed into a mirror surface 403 by highly precise machining. The mirror surface 403 is employed to measure the position of the carriage 4 by the length gauges 801, 802 and 803 (not shown in FIG. 12, see FIG. 1). While the wafer 5 is attracted to and held on the carriage 4, this can be made by utilizing vacuum attraction or electrostatic attraction, for example. Furthermore, the wafer 5 may be mechanically grasped to be held on the carriage 4 instead of attraction. In essence, it is only necessary for the wafer 5 to be held immobile on the carriage. The basic material 401 may be of a magnetic material such as iron having been subjected to heat treatment, and the plated layer may be of a non-electrolytic nickel plated layer, for example. Of course, usable materials are not limited the above described materials. In the case where the carriage 4 is attracted to the coarse adjustment stage 2 or the fine adjustment stage 3 using vacuum, for example, the basic material 401 can be of a soft metal such as aluminum, and the mirror surface 403 can be formed by directly high precision machining of the material surface.

Figure 13:
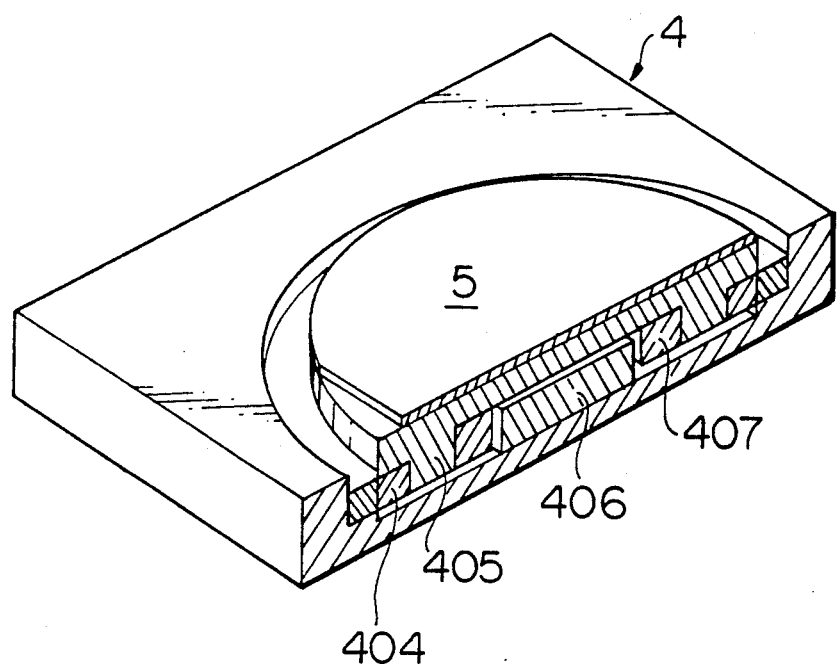
FIG. 13 is a perspective view showing another example of the carriage 4.

FIG. 13 provides a second practical example of the carriage 4. rotatable chuck 405 guided by a chuck guide mechanism 404 is A rotatably provided in the carriage 4. The rotatable chuck 405 onto which the wafer 5 is attracted is driven by a motor comprising a stator 406 provided on the carriage 4 and a rotor 407 provided on the rotatable chuck 405. Note that the method of driving the rotatable chuck 405 is not limited to this embodiment. Alternatively, the rotatable chuck 405 may be driven by a motor through a speed reducer, or a ultrasonic motor using a piezoelectric element, for example. In either case, since the wafer 5 can be rotated on the carriage 4, it becomes easy to position the wafer 5 on the carriage 4.

Next, operational principles and features of the embodiment of FIG. 1 will be described.

Figure 14:
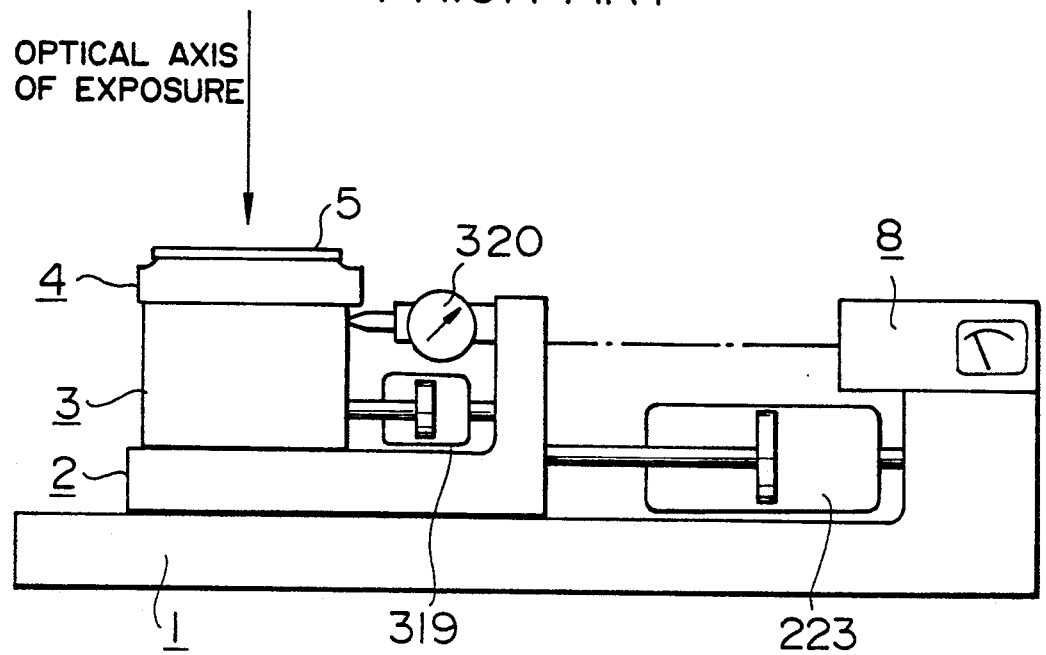
FIG. 14 is a plan view showing operational principles of a conventional stacked-type sample carriage moving apparatus of fine and coarse adjustment.

As shown in FIG. 14 in a conventional stacked-type sample moving apparatus of fine and coarse adjustment, a coarse adjustment stage 2, driven by a coarse adjustment stage drive actuator 223, is mounted on a base 1, and the position of the coarse adjustment stage 2 is measured by a length gauge 8. A fine adjustment stage 3, driven by a fine adjustment stage drive actuator 319, is mounted on the coarse adjustment stage 2, and the position of the fine adjustment stage 2 is measured by a sensor 320. A carriage 4, onto which a wafer 5 is attracted, is mounted on the fine adjustment stage 3. With the sample moving apparatus thus constituted, error in detecting the position of the coarse adjustment stage 2 and error in positioning the fine adjustment stage 3 are multiplied by each other, and the thus-multiplied result determines error in positioning the wafer. Furthermore, the coarse adjustment stage 2 is required to provide a stroke nearly equal to the diameter of the wafer 5.

Figure 15:
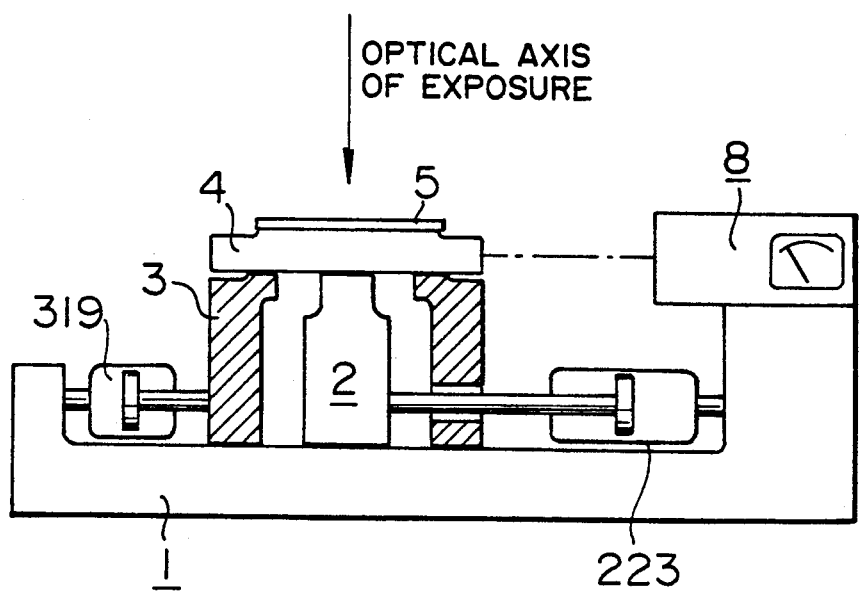
FIG. 15 is a plan view showing operational principles of a sample moving apparatus according to the present invention.

Meanwhile, As shown in FIG. 15 in a sample moving apparatus of the present invention same parts as those in FIGS. 1 and 14 are designated by the coarse adjustment stage 2, driven by the coarse adjustment stage drive actuator 223 and the fine adjustment stage 3 driven by the fine adjustment stage drive actuator 319, are mounted on the base 1 such that both the stages 2, 3 can be driven independently of each other. The position of the carriage 4 onto which the wafer 5 is attracted is measured directly by the length gauge 8. When moving the carriage 4 to a large extent, it is moved while being alternately attracted to and released from the coarse adjustment stage and the fine adjustment stage. During the stepped movement, the carriage 4 is moved while being attracted to the coarse adjustment stage 2, and during fine movement for positioning, the carriage 4 is moved while being attracted to the fine adjustment stage 3. With the sample moving apparatus thus constituted, the coarse adjustment stage 2 and the fine adjustment stage 3 can be moved independently of each other without causing interference therebetween. Further, since the wafer 5 is fixedly mounted on the carriage 4 and the position of the carriage 4 is directly detected, error in positioning the wafer 5 is affected by only error caused in positioning control of the fine adjustment stage 3. Stated otherwise, error in positioning the coarse adjustment stage 2 will not affect error in positioning the wafer 5. This permits to position the wafer 5 or the sample with high accuracy. In addition, since large movement of the sample is performed by rechucking the fine and coarse adjustment stages 2, 3 alternately several times, the coarse adjustment stage 2 is only necessary to provide X- and Y-axis strokes substantially equal to the exposure area of the wafer 5. Therefore, the apparatus can be significantly reduced in size and weight.

Figure 16:
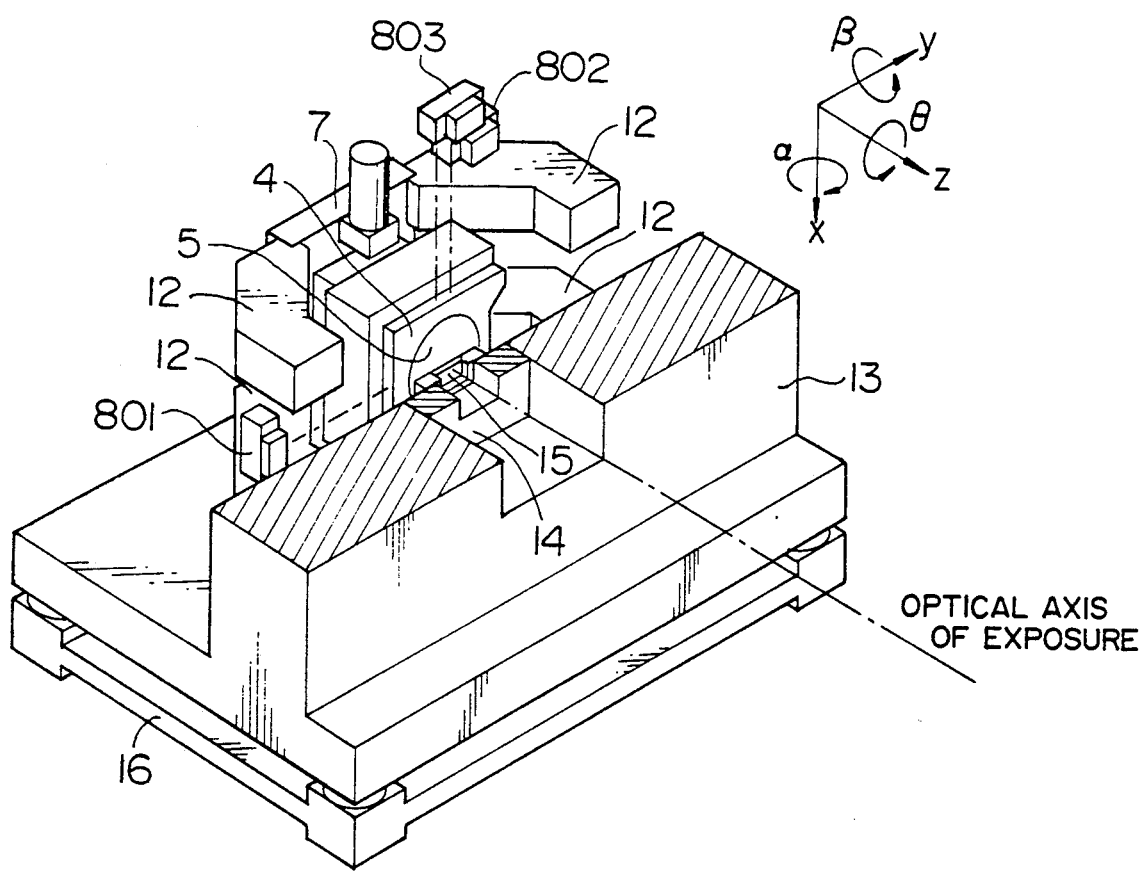
FIG. 16 is a perspective view showing one embodiment in which the sample moving apparatus according to the present invention is applied to an SOR aligner as one type of semiconductor manufacturing apparatus.

FIG. 16 provides one embodiment of the present invention in which the sample moving apparatus is incorporated in an SOR aligner using synchrotron radiation as a light source of exposure. The surface plate 7 of the sample moving apparatus is attached to a body 13 by four columns 12, and the position of the carriage 4 onto which the wafer 5 is attracted is measured by three length gauges 801, 802 and 803 mounted to the body 13. The body 13 includes a mask 15 attached to a mask fine adjustment block 14, and a pattern drawn on the mask 15 is transcribed to the wafer 5 by using the SOR light. To prevent vibrations from propagating from the floor surface to the apparatus, the body 13 is rested on a vibro-isolating platform 16.

Figure 17:
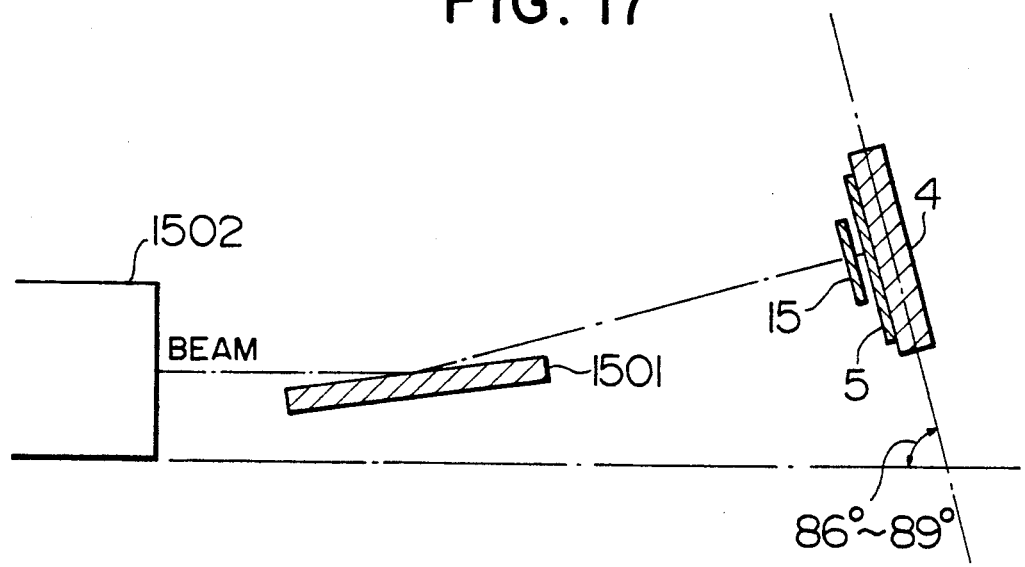
FIG. 17 is a sectional view showing one practical example of the relationship in attitude between the sample moving apparatus and an SOR ring.

FIG. 17 one practical example of an attitude of the sample carriage with respect to an SOR ring when the sample moving apparatus of the present invention is incorporated in the SOR aligner. In the SOR aligner, a beam is first spread by a vibrating mirror 1501 having a flat surface or a very slightly curved surface, and then irradiated to the wafer 5 through the mask 15 in many cases. Therefore, exposure can be performed with high accuracy by setting the sample carriage such that the scan surface of the carriage 4 (i.e., plane including both the x-axis and the y-axis in FIG. 1 or FIG. 16) forms an angle in a range from 86 T to 89 T with respect to the plane on which an SOR ring 1502 is installed. If the angle formed by the scan surface of the carriage 4 and the plane on which the SOR ring 1502 is installed is less than 86 T it is necessary an incident angle of the beam to the vibrating mirror 1501 is less, resulting in reduced reflectance of the vibrating mirror 1501. If the angle formed by the scan surface of the carriage 4 and the plane on which the SOR ring 1502 is installed is set to be larger than 89 T, it is necessary for the vibrating mirror 1501 has a very large overall length. Thus, either case out of range is unsatisfactory.

Figure 18:
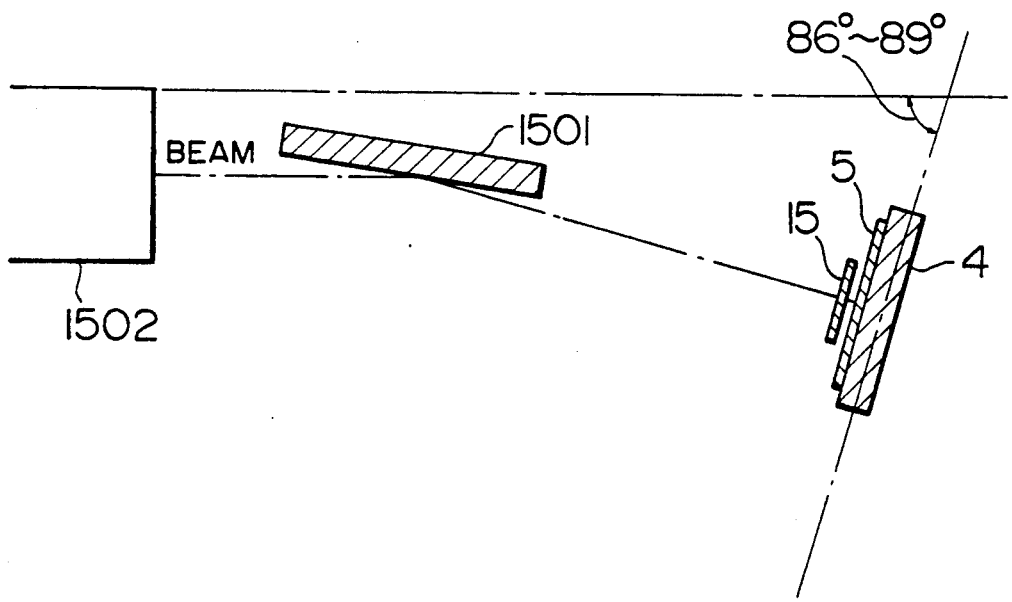
FIG. 18 is a sectional view showing a second practical example of the relationship in attitude between the sample moving apparatus and the SOR ring.

FIG. 18 provides another practical example of an attitude of the sample carriage with respect to the SOR ring when the sample moving apparatus according to the present invention is incorporated in the SOR aligner. In this embodiment, the angle formed by the scan surface of the carriage 4 and the plane on which the SOR ring 1502 is installed falls in an angular range of from 86 T to 89 T degrees. While the exposure surface of the wafer 5 is directed slightly downwards in FIG. 17 because of the reflective surface of the vibrating mirror 1501 lying on the upper side, the exposure surface of the wafer 5 is directed slightly upwards in FIG. 18 because of the reflective surface of the vibrating mirror 1501 lying on the lower side. This leads to an advantage that the mask 15 is less likely to be damaged even when the wafer 5 or the carriage 4 is dropped in the event of power outage.

Figure 19:
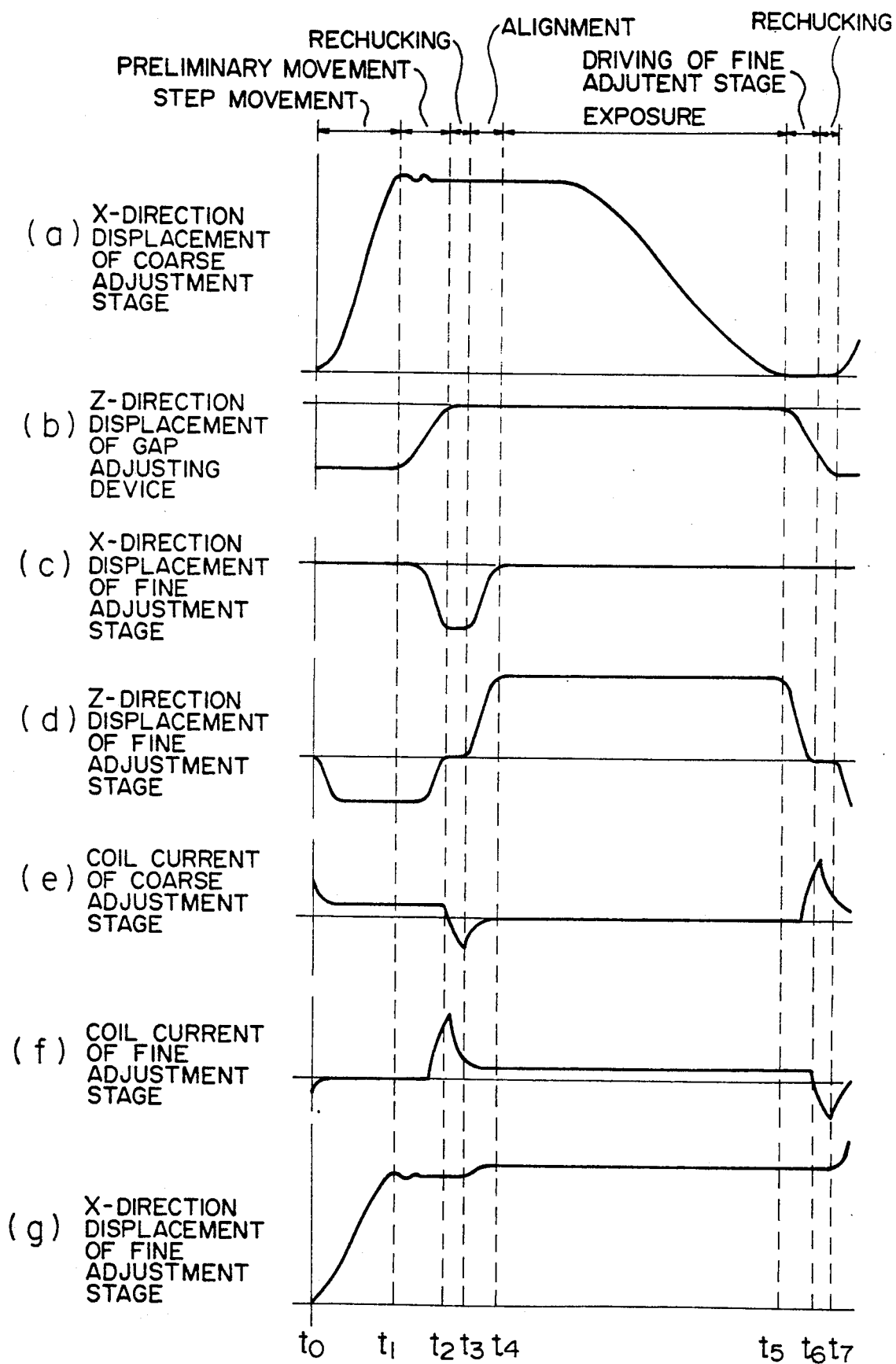
FIG. 19 is a timing chart for explaining one embodiment of a control method for the sample moving apparatus according to the present invention.

The timing chart of FIG. 19 depicts one embodiment of a control method for the sample moving apparatus of the present invention which is incorporated in the SOR aligner as shown in FIG. 16. In FIG. 19, the abscissas represent time bases of the same scale, while the ordinate respectively represent from top to bottom (a) x-direction displacement of the coarse adjustment stage 2, (b) z-direction displacement of the gap adjusting device 6, (c) x-direction displacement of the fine adjustment stage 3, (d) z-direction displacement of the fine adjustment stage 3, (e) current flowing through the coil 219 (FIG. 7) provided in the coarse adjustment stage 2 for electromagnetic attraction, (f) current flowing through the coil 219 provided in the fine adjustment stage 3, and (g) x-direction displacement of the carriage 4. During step movement (time period of $t_0$-$t_1$), the carriage 4 is moved stepwise in the x-direction while being electromagnetically attracted to the coarse adjustment stage 2 ((a)). During this period, the fine adjustment stage 3 is retreated in the negative z-direction ((d)), whereby the carriage 4 and the fine adjustment stage 3 are controlled so as to be kept from interference therebetween. The gap adjusting device 6 is also retreated in the negative z-direction ((b)) during that period to increase the gap between the wafer 5 and the mask 15, whereby the mask 15 is prevented from being damaged due to contact between the wafer 5 and the mask 15.

At the time point $t_1$ when the x-direction step movement of the coarse adjustment stage 2 has been completed, the fine adjustment stage 3 starts to preliminarily move in the x-direction in accordance with positional deviation of the carriage 4 ((c)). Simultaneously, the fine adjustment stage 3 is moved in the z-direction as well ((d)) and, at the time point $t_2$, both the coarse adjustment stage 2 and the fine adjustment stage 3 come into contact with the carriage 4. During period of $t_1$-$t_2$, the gap adjusting device 6 is also moved in the z-direction ((b)) to reduce the gap between the wafer 5 and the mask 15.

Then, the current for electromagnetically attracting the carriage 4 is applied to the coil 219 in the fine adjustment stage 3 ((f)), and the current for interrupting the electromagnetic attraction to the carriage 4 is applied to the coil 219 in the coarse adjustment stage 2 ((e)). This causes the carriage 4 to become free from the coarse adjustment stage 2 and follow to movement of the fine adjustment stage 3 (rechucking).

During next period of $t_3$-$t_4$, the fine adjustment stage 3 is driven in the x- and z-directions aligning of the wafer 5 ((c), (d)). Then, exposure is performed during period of $t_4$-$t_5$. While the wafer 5 is being subjected to exposure, the coarse adjustment stage 2 returns to its original position ((a)) to be ready for the next step movement At this time, since the fine adjustment stage 3 is at an elevated position in the z-direction ((d)) to hold the carriage 4 there, the coarse adjustment stage 3 will not contact with the carriage 4.

At the time point $t_5$ when exposure of the wafer 5 has been completed, the fine adjustment stage 3 is driven in the z-direction ((d)) so that both the coarse adjustment stage 2 and the fine adjustment stage 3 come into contact with the carriage 4. Simultaneously, the gap adjusting device 6 is also driven in the z-direction ((b)) to increase the gap between the wafer 5 and the mask 15. Here, the current for electromagnetically attracting the carriage 4 is applied to the coil 219 in the coarse adjustment stage 2 ((e)), and the current for interrupting the electromagnetic attraction to the carriage 4 is applied to the coil 219 in the fine adjustment stage 3 ((f)). At the time point $t_7$, rechucking of the carriage 4 from the fine adjustment stage 3 to the coarse adjustment stage 2 is finished.

Through the above procedure, the carriage 4 is subjected to a series of operations of step movement, alignment and exposure, thereby completing exposure of one shot. It is to be noted that y-direction displacement of the coarse adjustment stage 2, y-direction displacement and θ-direction rotation of the fine adjustment stage 3, and rotations of the fine adjustment stage 3 in the α- and β-directions can be performed in a like manner to the above, and hence will not be further explained.

Figure 20:
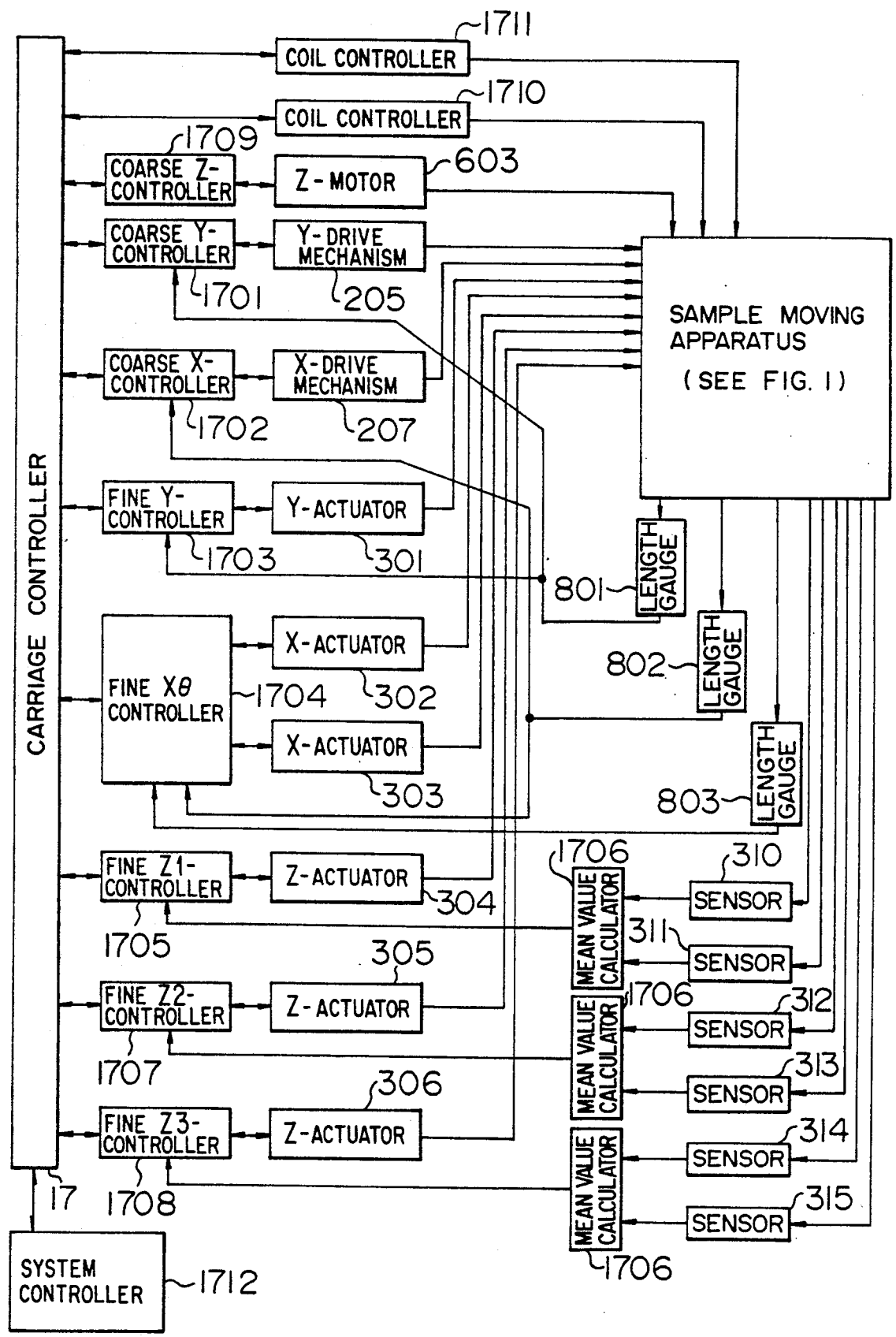
FIG. 20 is a block diagram showing one example of a sample moving system according to the present invention.

FIG. 20 provides an example of one embodiment of a system for implementing the procedure of controlling the sample moving apparatus of the present invention as shown in FIG. 19. The Y-drive mechanism 205 is driven by a coarse Y-controller 1701. The amount of Y-movement of the sample carriage (see FIG. 1) at this time is measured by the length gauge 801, and the resulting information is input to the coarse Y-controller 1701. Likewise, the X-drive mechanism 207 is driven by a coarse X-controller 1702. The amount of movement of the carriage 4 at this time is measured by the length gauge 802, and the resulting information is input to the coarse X-controller 1702.

The actuator 301 is driven by a fine Y-controller 1703. The amount of movement of the carriage 4 at this time is measured by the length gauge 801, and the resulting information is input to the fine Y-controller 1703. The actuators 302 and 303 are driven by a fine Xθ-controller 1704. The amounts of movement of the carriage 4 at this time are measured by the length gauges 802, 803, and the resulting information is input to the fine Xθ-controller 1704. At this time, the length gauges 802 and 803 detect the displacement of the x-direction movement and the amount of θ-direction rotation of the carriage 4.

The actuator 304 is driven by a fine Z1-controller 1705, and the amount of movement of the fine adjustment stage 3 (FIG. 1) at this time is measured by the sensors 310, 311. A mean value of the measured results is calculated by a mean value calculator 1706 and then input to the fine Z1-controller 1705. The actuator 305 is driven by a fine Z2-controller 1707, and the amount of movement of the fine adjustment stage 3 at this time is measured by the sensors 312, 313. A mean value of the measured results is calculated by a mean value calculator 1706 and then input to the fine Z2-controller 1707. The actuator 306 is driven by a fine Z3-controller 1708, and the amount of movement of the fine adjustment stage 3 at this time is measured by the sensors 314 and 315. A mean value of the measured results is calculated by a mean value calculator 1706 and then input to the fine Z3-controller 1708.

A Z-motor 603 is driven by a coarse Z-controller 1709. The coil 219 (FIG. 7) provided in the coarse adjustment stage 2 (FIG. 1) for electromagnetic attraction is energized through an attraction coil controller A1710, while the coil 219 (FIG. 7) provided in the fine adjustment stage 3 (FIG. 1) for electromagnetic attraction is energized through an attraction coil controller B1711.

The coarse Y-controller 1701, the coarse X-controller 1702, the fine Y-controller 1703, the fine Xθ-controller 1704, the fine Z1-controller 1705, the fine Z2-controller 1707, the fine Z3-controller 1708, the coarse Z-controller 1709, the attraction coil controller A1710 and the attraction coil controller B1711 are separately controlled by a carriage controller 17 which is in turn controlled by a system controller 1712.

Figure 22:
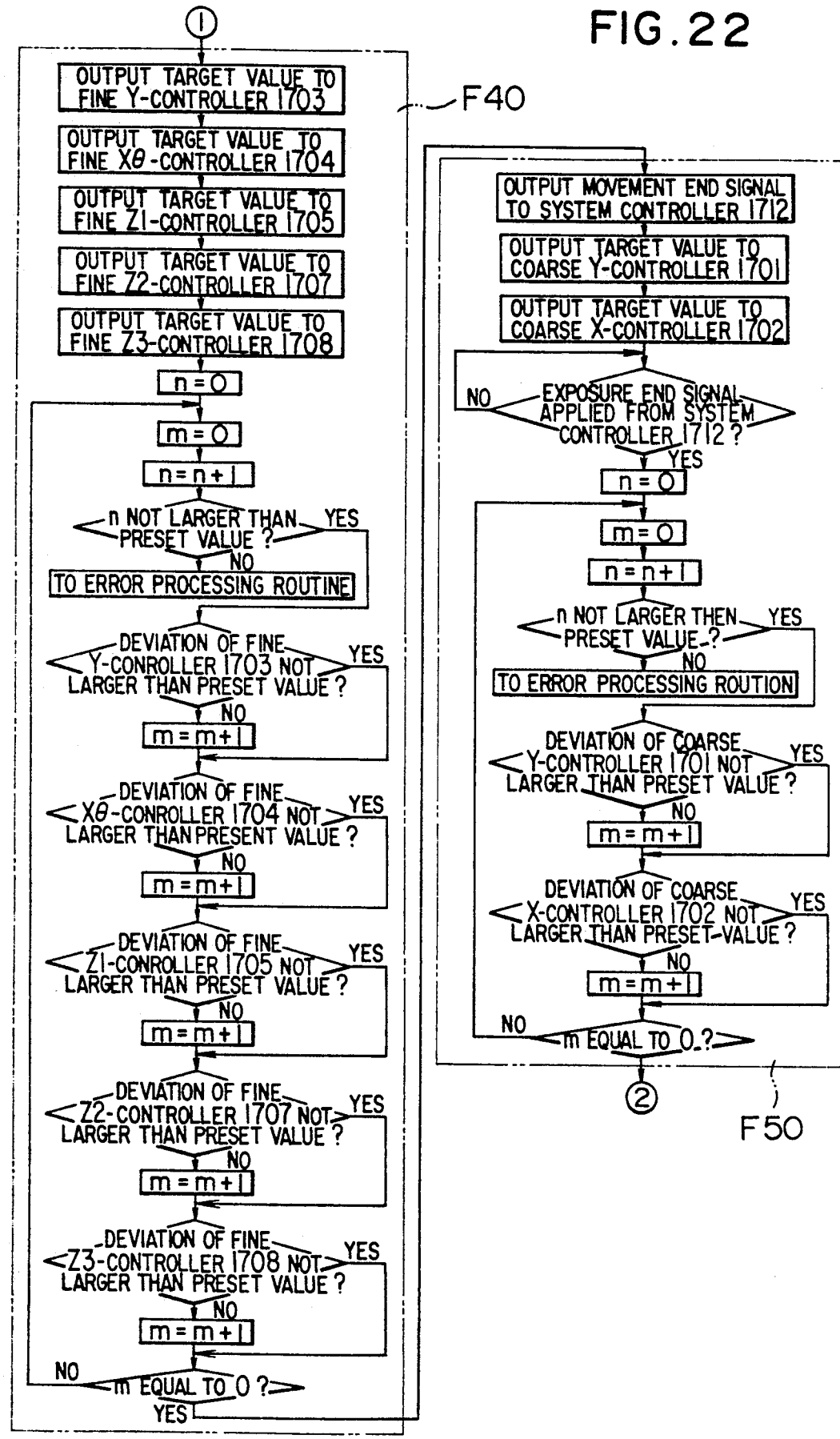
Figure 23:
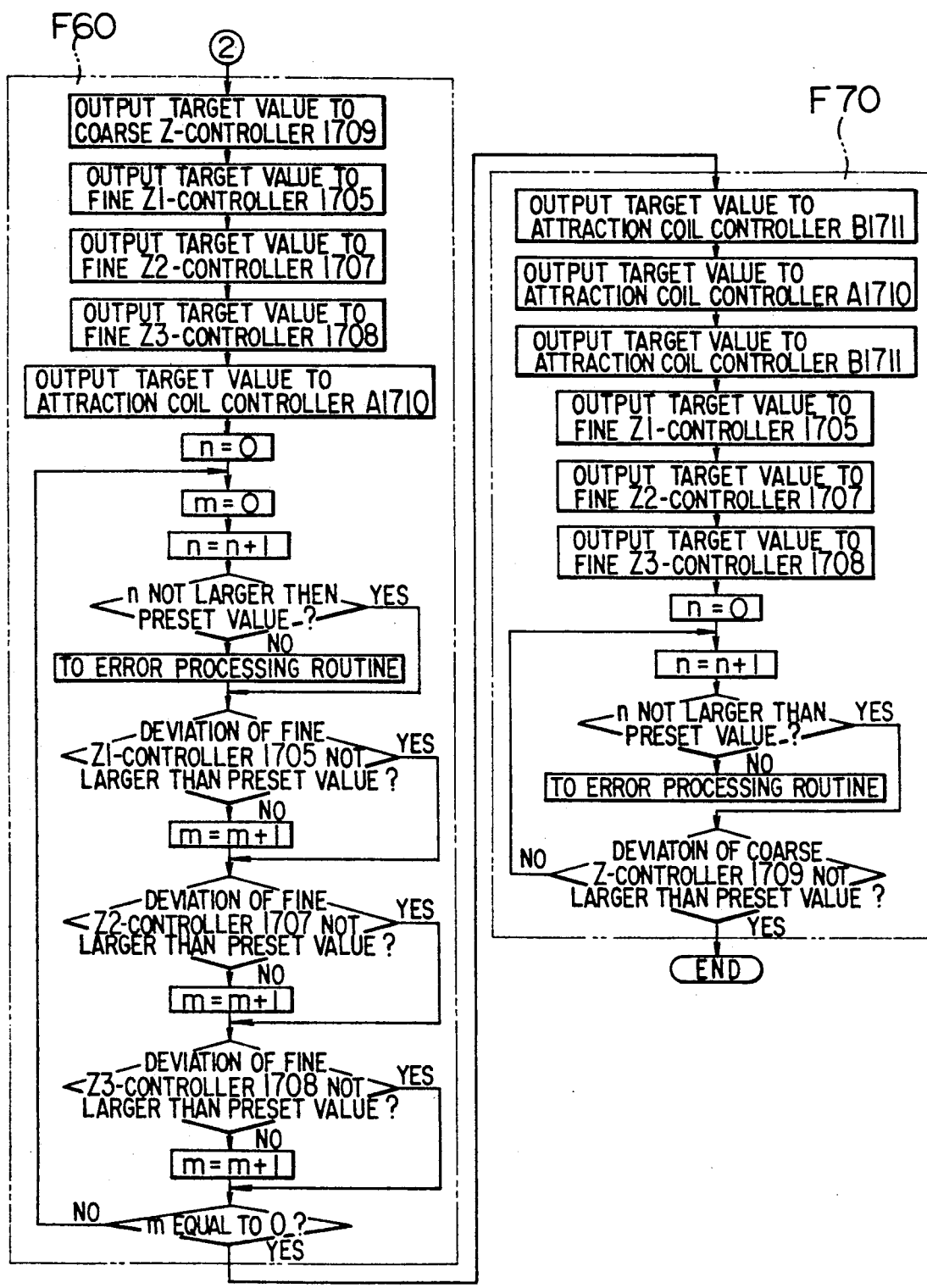

FIGS. 21, 22 and 23 are flowcharts showing a control method for the carriage controller 17 shown in FIG. 20. FIG. 22 is a continued flowchart of FIG. 21 and FIG. 23 is a continued flowchart of FIG. 22. When a command to start operation is sent to the carriage controller 17 from the system controller 1712 shown in FIG. 20, the carriage controller 17 begins to execute a series of operations shown in FIG. 21 and the subsequent figures.

First, a process F10 is executed. More specifically, when the carriage controller 17 outputs respective target values to the coarse Y-controller 1701 and the coarse X-controller 1702, the coarse Y-controller 1701 and the coarse X-controller 1702 are operated to return respective deviations back to the carriage controller 17. The carriage controller 17 confirms that those deviations are not larger than a preset value. Unless those deviations become not larger than the preset value even after making confirmations preset times, this is judged as an abnormal condition and the carriage controller proceeds to an error processing routine.

After completion of such operations of the coarse Y-controller 1701 and the coarse X-controller 1702, the carriage controller proceeds to a next process F20.

In the process F20, the carriage controller 17 outputs a target value to the coarse Z-controller 1709 and then receives respective deviations from the fine Y-controller 1703 and the fine Xθ-controller 1704. In order to move the fine adjustment stage 3 (FIG. 1) through amounts corresponding to those deviations in advance, the carriage controller 17 calculates respective target values for the fine Y-controller 1703 and the fine Xθ-controller 1704, and outputs the calculated values thereto. Then, in order to make the surfaces of both the coarse adjustment stage 2 and the fine adjustment stage 3 (FIG. 1) flush with each other, the carriage controller 17 outputs respective target values to the fine Z1-controller 1705, the fine Z2-controller 1707 and the fine Z3-controller 1708 and, thereafter, outputs a target value (preset maximum current, see FIG. 10) to the attraction coil controller B1711. At this time, the carriage controller 17 receives respective deviations from the fine Z1-controller 1705, the fine Z2-controller 1707 and the fine Z3-controller 1708 to confirm that those deviations are not larger than a preset value. Unless those deviations become not larger than the preset value even after making confirmations preset times, this is judged as an abnormal condition and the carriage controller proceeds to the error processing routine.

After completion of such operations of the fine Z1-controller 1705, the fine Z2-controller 1707 and the fine Z3-controller 1708, the carriage controller proceeds to a next process F30.

In the process F30, the carriage controller 17 outputs a target value (preset reverse current, FIG. 10) to the attraction coil controller A1710, a target value (preset constant current, FIG. 10) to the attraction coil controller B1711, and a target value (current cut-off) to the attraction coil controller A1710 in sequence. At this time, the carriage controller 17 receives a deviation from the coarse Z-controller 1709 to confirm that the deviation is not larger than a preset value. Unless the deviation becomes not larger than the preset value even after making confirmations preset times, this is judged as an abnormal condition and the carriage controller proceeds to the error processing routine.

After confirming completion of such operation of the coarse Z-controller 1709, the carriage controller proceeds to a next process F40.

In the process F40, the carriage controller 17 outputs respective target values to the fine Y-controller 1703, the fine Xθ-controller 1704, the fine Z1-controller 1705, the fine Z2-controller 1707 and the fine Z3-controller 1708. At this time, the carriage controller 17 receives respective deviations from the fine Y-controller 1703, the fine Xθ-controller 1704, the fine Z1-controller 1705, the fine Z2-controller 1707 and the fine Z3-controller 1708 to confirm that those deviations are not larger than a preset value. Unless those deviations become not larger than the preset value even after making confirmations preset times, this is judged as an abnormal condition and the carriage controller proceeds to the error processing routine. The foregoing is the process F40.

After completion of a series of operations mentioned above, the carriage controller proceeds to a process F50. In the process F50, the carriage controller 17 notifies the system controller 1712 of the fact that positioning of the carriage has been completed, and then outputs respective target values to the coarse Y-controller 1701 and the coarse X-controller 1702. These target values serve to move the coarse adjustment stage 2 (FIG. 1) in advance to be ready for the next movement. In this connection, by driving the coarse adjustment stage 2 in such a manner as to cancel the residual vibrations of the body (FIG. 16) provided on the vibro-isolating platform 16, there can be obtained the advantageous effect of improving accuracy of the apparatus.

At the time when a signal of notifying the end of exposure is applied from the system controller 1712, the carriage controller 17 receives respective deviations from the coarse Y-controller 1701 and the coarse X-controller 1702 to confirm that those deviations are not larger than a preset value. Upon this confirmation, it determines that movement of the coarse adjustment stage 2 has been ended, followed by proceeding to a next process F60. Unless those deviations become not larger than the preset value even after making confirmations preset times, this is judged as an abnormal condition and the carriage controller proceeds to the error processing routine.

In the process F60, the carriage controller 17 outputs a target value to the coarse Z-controller 1709 for increasing the gap between the wafer 5 and the mask 15 (FIG. 16). Then, in order to make the surfaces of both the coarse adjustment stage 2 and the fine adjustment stage 3 (FIG. 1) flush with each other, the carriage controller 17 outputs respective target values to the fine Z1-controller 1705, the fine Z2-controller 1707 and the fine Z3-controller 1708 and, thereafter, outputs a target value (preset maximum current, FIG. 10) to the attraction coil controller A1710. At this time, as shown in FIG. 23, the carriage controller 17 receives respective deviations from the fine Z1-controller 1705, the fine Z2-controller 1707 and the fine Z3-controller 1708 to confirm that those deviations are not larger than a preset value. Unless those deviations become not larger than the preset value even after making confirmations preset times, this is judged as an abnormal condition and the carriage controller proceeds to the error processing routine.

After completion of such operations of the fine Z1-controller 1705, the fine Z2-controller 1707 and the fine Z3-controller 1708, the carriage controller proceeds to a next process F70.

In the process F70, the carriage controller 17 outputs a target value (preset reverse current, FIG. 10) to the attraction coil controller B1711, a target value (preset constant current, FIG. 10) to the attraction coil controller A1710, and a target value (current cut-off) to the attraction coil controller B1711 in sequence. At this time, the carriage controller 17 receives a deviation from the coarse Z-controller 1709 to confirm that the deviation is not larger than a preset value, whereby all of the operations are brought into an end. Unless the deviation becomes not larger than the preset value even after making confirmations preset times, this is judged as an abnormal condition and the carriage controller proceeds to the error processing routine.

As described above, the control method for the sample moving apparatus shown in FIG. 19 can be implemented by operating the controllers shown in FIG. 20 following the procedures shown in FIGS. 21, 22 and 23. It should be understood that the method of operating the sample moving apparatus of the present invention is not limited to the above embodiment, and that the similar advantageous effect can also be obtained in those cases where the sample moving apparatus of the present invention is applied to such other exposure apparatus as using a mercury lamp, excimer laser or point X-ray source, for example.

In the event that the operation proceeds to the error processing routine during the procedures of FIGS. 21, 22 and 23, the carriage controller 17 promptly takes such steps as to terminate a series of operation under progress and return the carriage back to a predetermined position, while notifying the system controller 1712 of the occurrence of an abnormal condition.

Figure 24:
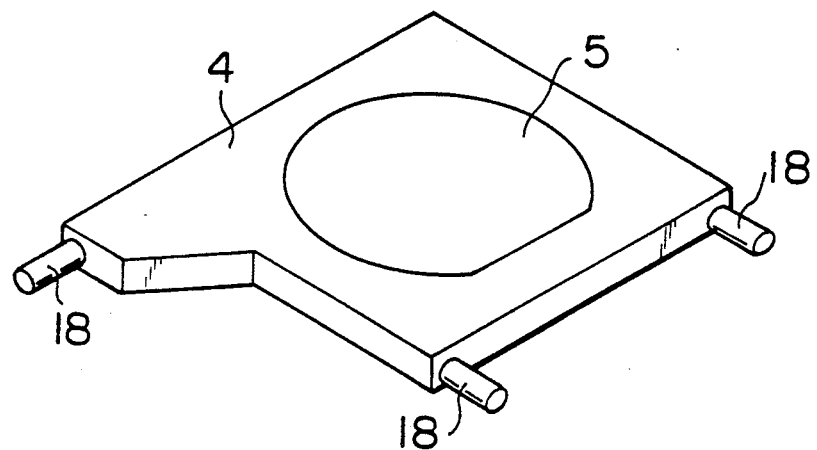
FIG. 24 is a perspective view showing one example of an initially setting device for the carriage.

FIG. 24 provides one example of an initially setting mechanism for use in the sample moving apparatus. Three positioning pins 18 are provided on the base 1, or the surface plate 7, or the body 13 (FIGS. 1 and 16). The carriage 4 can be initially set by resetting the length gauges 801, 802 and 803 (FIGS. 1 and 16) under such a condition that the positioning pins 18 are held in abutment with the carriage 4.

Figure 25:
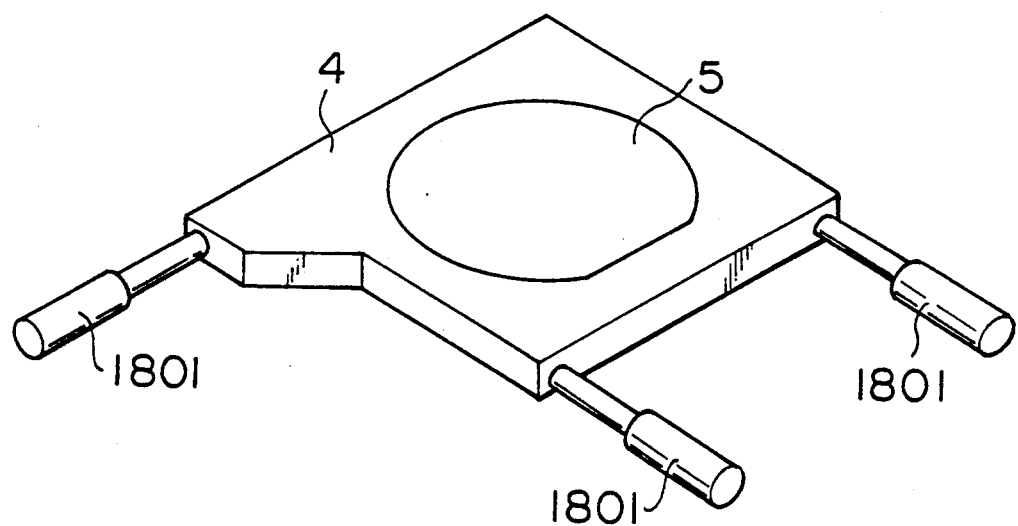
FIG. 25 is a perspective view sowing another example of the initially setting device for the carriage.

FIG. 25 provides another example of the initially setting mechanism for the carriage 4. Three origin sensors 1801 are provided on the base 1, or the surface plate 7, or the body 13 (FIGS. 1 and 16). The carriage 4 is initially set by resetting the length gauges 801, 802 and 803 (FIG. 1 and 16) after the carriage 4 has been moved to such a position as allowing the three origin sensors 1801 to output preset values. On this occasion, the carriage 4 can be moved using the coarse adjustment stage 2 and the fine adjustment stage 3.

It should be understood that in those cases where the carriage 4 is not required to be initially set with so high accuracy, the above initially setting mechanism may be dispensed with.

Figure 26:
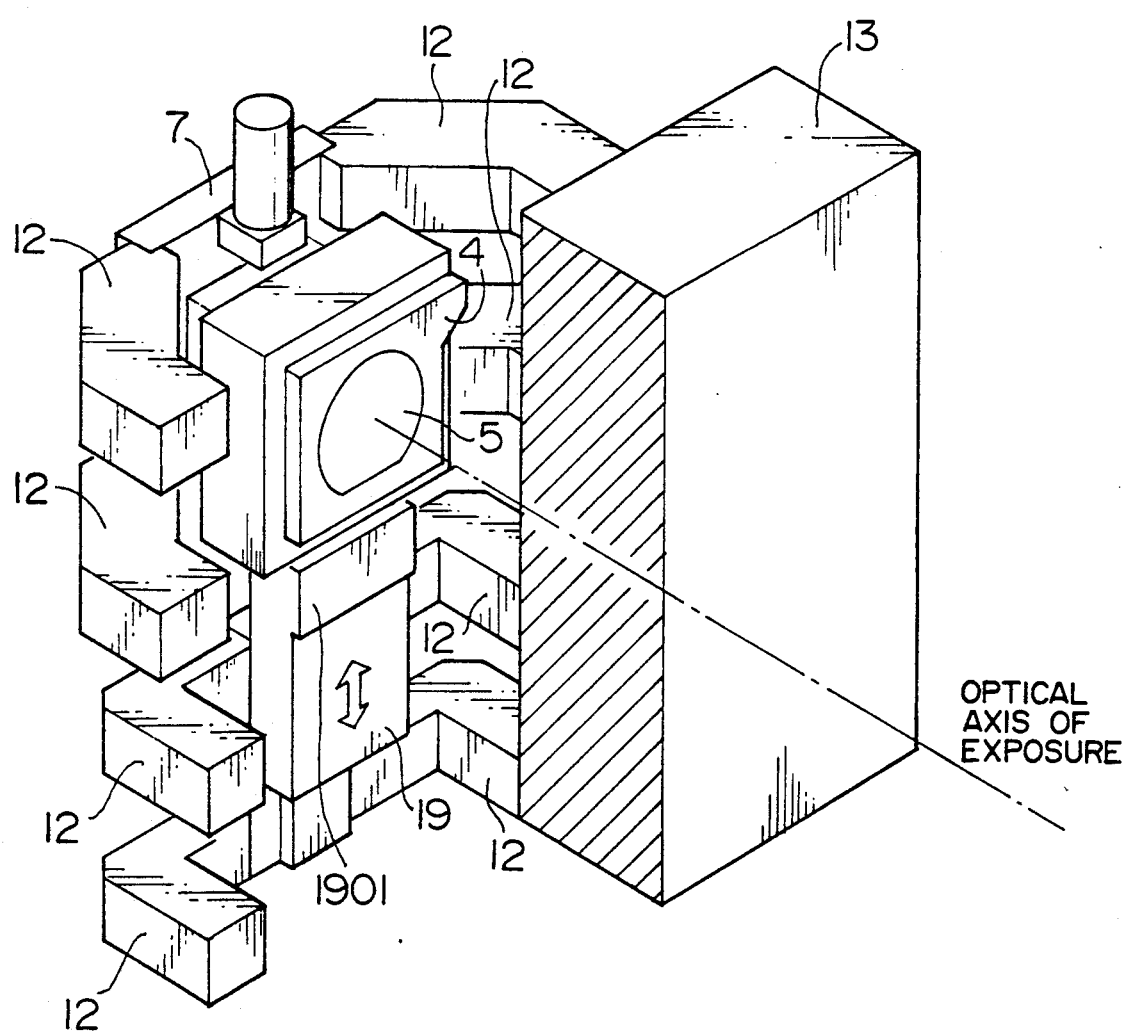
FIG. 26 is a perspective view showing a practical example of an auxiliary stage 19.

FIG. 26 provides one example of an auxiliary stage to be used when the sample moving apparatus according to the present invention is applied to the exposure apparatus. The sample moving apparatus as shown in FIG. 1 is provided to the body 13 with the surface plate 7 being supported by the columns 12, and an auxiliary stage 19 is also provided using other columns in a like manner. The auxiliary stage 19 is movable in a direction of the double-headed arrow in FIG. 26 and has a chuck 1901 capable of attracting the carriage 4. When the attraction coupling between the coarse adjustment stage 2 as well as the fine adjustment stage 3 (FIG. 1) and the carriage 4 is interrupted while attracting the carriage 4 by the chuck 1901, the carriage 4 can be moved through a long distance. This facilitates such operations as mounting of the wafer 5 onto the carriage 4, mounting of the mask 15 onto the mask fine adjustment block 14 (FIG. 16). It should be understood that the moving direction of the auxiliary stage 19 is not limited to that in the above embodiment, and the similar advantageous effect can also be obtained in those case of moving the auxiliary stage 19 in any other directions.

Figure 27:
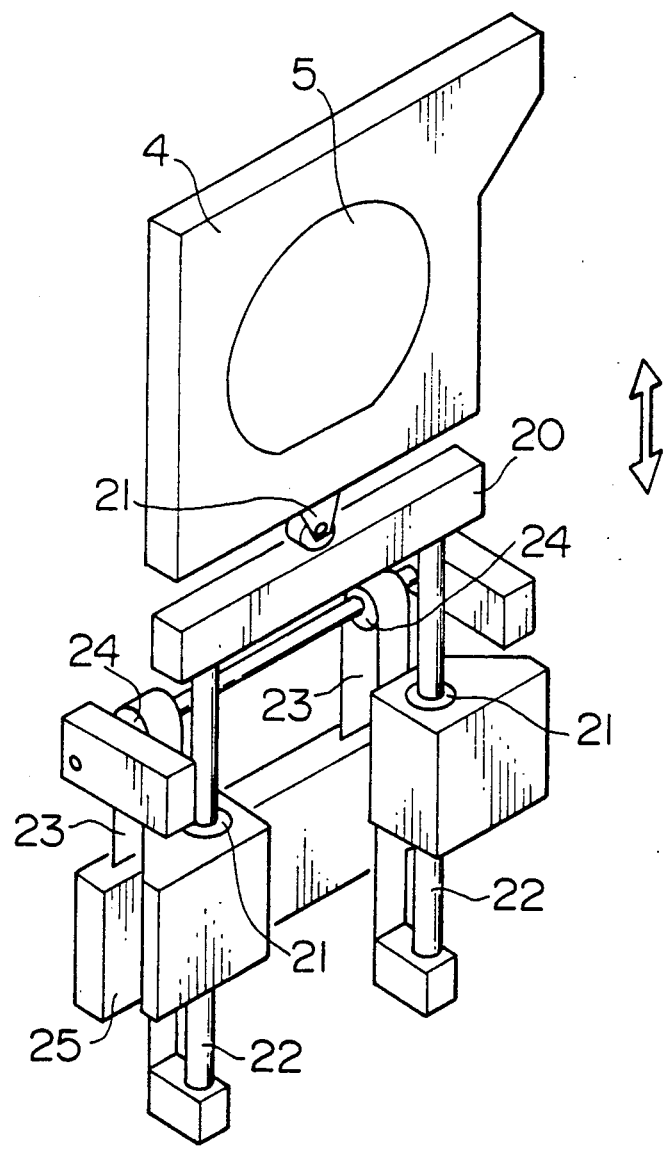
FIG. 27 is a perspective view showing one example of a dead load compensating mechanism.

FIG. 27 provides one example of a dead load compensating mechanism to be used when the sample moving apparatus according to the present invention is incorporated into the SOR aligner. A roller 21 is provided at the bottom side of the carriage 4 and is adapted to be rolled over a support rod 20. The support rod 20 is movable in a direction of the double-headed arrow in the FIG. 27 through a pair of lift rods 22 each guided by a lift rod guide mechanism 21 provided on the body 13 (FIG. 16). Metal belts (e.g., steel belts) 23 are attached at one ends to the lower ends of the lift rods 22, respectively. The steel belts 23 are extended while running round pulleys 24 provided on the body 13 (FIG. 16), and a balance weight 25 is suspended from the other ends of the steel belts 23. With such arrangement, the dead load of the carriage 4 by the balance weight 25, makes it possible to prevent deterioration in positioning accuracy of the carriage 4 due to the dead load thereof. It should be understood that the similar advantageous effect can be obtained in those cases of using other structures of the dead load compensating mechanism than that of this embodiment. Where there is no need of using the dead load compensating mechanism, it may be dispensed with. As an alternative, the auxiliary stage 19 (FIG. 24) may be arranged to double as a dead load compensating mechanism.

FIG. 28 provides a second embodiment of the sample moving apparatus of the present invention. A fine adjustment stage 3 is mounted on the base 1, while a Y-table 201 guided in the y-direction and an X-table 203 guided in the x-direction are mounted on the fine adjustment stage 3. The Y-table 201 is driven by a Y-drive mechanism 205 through a Y-rod 206, and the X-table 203 is driven by an X-drive mechanism 207 through an X-rod 210. When moving a carriage 4 (FIG. 1) stepwisely in the x-direction, the carriage 4 is attracted to the X-table 203 and moved together with the X-table. When moving the carriage 4 stepwisely in the y-direction, the carriage 4 is attracted to the Y-table 201 and moved together with the Y-table. When moving the carriage 4 finely in the x, y, z, α, β and θ-directions, the carriage 4 is attracted to the fine adjustment stage 3 so that the carriage is moved together with the fine adjustment stage 3 upon driving of associated actuators. In this embodiment, there are provided self-controlled restrictors 26 in the Y-table 201, the X-table 203 and the fine adjustment stage 3. When any one or more of the Y-table 201, the X-table 203 and the fine adjustment stage 3 are not attracting the carriage 4, air is ejected through those restrictors provided on those table(s) and/or stage to lubricate between them and the carriage 4 by static air. For example, when the carriage 4 is attracted to the x-table 203 and moved stepwisely in the x-direction, the auto-controlled restrictors 26 provided on the Y-table 201 and the fine adjustment stage 3 can serve to lubricate between the Y-table 201 as well as the fine adjustment stage 3 and the carriage 4 by static air. It should be understood that the Y-table 201, the X-table 203 and the fine adjustment stage 3 may be slid directly relative to the carriage 4 by dispensing with the auto-controlled restrictors 26. Guide of the Y-table 201 and the X-table 203, as well as attraction of the Y-drive mechanism 205, the X-drive mechanism 207, the fine adjustment stage 3 and the carriage 4 can be performed in like manners to those explained above in connection with FIGS. 2, 4 and 7, and hence will not be further described.

In short, according to the present invention, error in positioning the coarse adjustment stage 3 and error in detecting the position thereof will no longer affect the accuracy of positioning the sample. Since the position of the carriage onto which the wafer is attracted is measured directly by the length gauges, the sample can be positioned with high accuracy. Therefore, when the present invention is applied to exposure apparatus, for example, it becomes possible to drastically improve array accuracy and super-position accuracy of patterns transcrived to the sample.

What is claimed is:

1. A sample moving apparatus comprising:
  a fine adjustment actuator provided on a base;
  a fine adjustment stage driven by said fine adjustment actuator; a coarse drive mechanism provided on said base;
  a coarse adjustment stage driven by said coarse drive mechanism; and hold means for attractively holding a sample table onto sample table bearing surfaces of said fine adjustment stage and said coarse adjustment stage, and
  wherein said fine adjustment stage and said coarse adjustment stage are independent of each other and each of said adjustment stages is respectively directly mounted on said common base.

2. A sample moving apparatus comprising:
  a base;
  a fine adjustment actuator mounted on said base;
  a fine adjustment stage driven by said fine adjustment actuator;
  a coarse drive mechanism mounted on said base;
  a coarse adjustment stage driven by said coarse drive mechanism;
  means for changing relative position levels of object bearing surfaces of said fine adjustment stage and said coarse adjustment stage;
  first hold means formed in an object bearing surface portion of said fine adjustment stage for holding an object to be moved; and
  second hold means formed in an object bearing surface portion of said coarse adjustment stage for holding the object to be moved.

3. A sample moving apparatus according to claim 2, wherein measuring means for measuring a position of the object is provided on a stationary side.

4. A sample moving apparatus according to claim 2, further comprising base drive means for moving said base vertically.

5. A sample moving apparatus according to claim 2, wherein at least one of said first and second hold means respectively holds the object by vacuum attraction.

6. A sample moving apparatus according to claim 2, wherein at least one of said first and second hold means respectively holds the object by magnetic attraction.

7. A sample moving apparatus according to claim 2, wherein at least one of said first and second hold means respectively holds the object by electrostatic attraction.

8. A sample moving apparatus according to claim 2, wherein said coarse adjustment stage comprises:
  a Y-stage movable in a y-direction; and
  an X-stage rested on said Y-stage and movable in a x-direction perpendicular to the y-direction, and wherein said coarse drive mechanism comprises:
  a drive mechanism for driving said Y-stage in the y-direction; and
  a drive mechanism for driving said X-stage in the x-direction.

9. A sample moving apparatus comprising:
a coarse adjustment stage rested on a base to be movable in x- and y-directions;
a fine adjustment stage arranged in the circumferential direction of said coarse adjustment stage and having a space enough to allow movement of said coarse adjustment stage;
coarse drive means for driving said coarse adjustment stage in the x- and y-direction;
fine drive means provided on said base for driving said fine adjustment stage in the x-, y- and z-directions; and
hold means for holding an object onto respective object supporting surfaces of said fine adjustment stage and said coarse adjustment stage.

10. A sample moving apparatus according to claim 9, further comprising gap adjusting means for moving said base in the z-direction.

11. A sample moving system comprising:
a carriage for holding a sample;
a coarse adjustment stage having means for attracting said carriage and being movable in directions of an xy-plane;
a fine adjustment stage having means for attracting said carriage and being movable at least in directions of the xy-plane independently of movement of said coarse adjustment stage;
coarse drive means for driving said coarse adjustment stage;
fine drive means for driying said fine adjustment stage;
measuring means for measuring a position of said carriage on the xy-plane; and
position control means for deriving an amount to be driven for control based on a deviation between target values of the position of said carriage and the measured values by said measuring means, and then supplying the derived amount to be driven from control to said fine drive means to thereby perform positioning control, and
wherein said fine adjustment stage and coarse adjustment stage are independent of each other and each of said adjustment stages is respectively directly mounted on a common base.

12. A sample moving apparatus comprising a carriage for attracting a sample; length gauges for measuring a position of said carriage; an X-table capable of attracting said carriage and moving strightforwards; a Y-table capable of attracting said carriage and moving straightforwards in a direction orthogonal to the moving direction of said X-table; a fine adjustment stage mounting thereon both said X-table and said Y-table, attracting said carriage and being movable at least in two orthogonal directions; and a base on which said fine adjustment stage is mounted.

13. A sample moving apparatus according to claim 12, further comprising moving means which can move said base in a third direction orthogonal to both the moving direction of said X-table and the moving direction of said Y-table.

14. A sample moving apparatus according to claim 12 or 13, wherein attraction between said X-table and said carriage, attraction between said Y-table and said carriage, and attraction between said fine adjustment stage and said carriage are effected electromagnetically.

15. A sample moving apparatus according to claim 14, further comprising a device which applies once a preset maximum current to a coil for electromagnetic attraction and, then reduces a current level applied to said coil.

16. A sample moving apparatus or system according to any one of claims 1 to 11, further comprising an auxiliary stage which can attract and move said moving apparatus in at least one direction.

17. A sample moving apparatus according to one of claims 1, 2, 3, 4 or 12, wherein a wafer is attracted to said carriage and synchrotron radiation is irradiated to said wafer.

18. A semiconductor manufacturing apparatus according to claim 17, wherein an angle formed between a plane in which an SOR ring for generating synchrotron radiation is installed and a plane in which said carriage attracting said wafer is scanned falls in a range not smaller than 86 degrees and not larger than 89 degrees.

* * * * *